(12) United States Patent
Lee et al.

(10) Patent No.: US 8,901,009 B2
(45) Date of Patent: Dec. 2, 2014

(54) METHODS OF MANUFACTURING SEMICONDUCTOR DEVICES

(71) Applicant: Samsung Electronics Co., Ltd., Suwon-si (KR)

(72) Inventors: Jaekyu Lee, Yongin-si (KR); Kiseok Suh, Hwasung (KR); Tae Eung Yoon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/134,008

(22) Filed: Dec. 19, 2013

(65) Prior Publication Data

US 2014/0106535 A1 Apr. 17, 2014

Related U.S. Application Data

(62) Division of application No. 13/463,244, filed on May 3, 2012, now Pat. No. 8,614,433.

(30) Foreign Application Priority Data

Jun. 7, 2011 (KR) .................. 10-2011-0054447

(51) Int. Cl.
*H01L 45/00* (2006.01)
*H01L 27/24* (2006.01)

(52) U.S. Cl.
CPC ............ *H01L 45/1691* (2013.01); *H01L 45/06* (2013.01); *H01L 45/1233* (2013.01); *H01L 45/1273* (2013.01); *H01L 45/143* (2013.01); *H01L 45/144* (2013.01); *H01L 45/148* (2013.01); *H01L 27/2409* (2013.01); *H01L 27/2463* (2013.01); *H01L 27/2481* (2013.01); *H01L 45/1641* (2013.01)
USPC ........................................ 438/739

(58) Field of Classification Search
CPC ................. H01L 21/02518; H01L 27/1021; H01L 27/2409; H01L 45/06; H01L 45/1233; H01L 45/144; H01L 27/2481; H01L 21/768; H01L 27/10885; H01L 27/10891; H01L 27/2463
USPC .............. 438/739; 257/319, 4, E21.001, 257/E21.158, E21.422, E45.002, E29.326, 257/E31.085, E47.001
See application file for complete search history.

(56) References Cited

U.S. PATENT DOCUMENTS

| | | | |
|---|---|---|---|
| 8,609,492 B2 * | 12/2013 | Beigel et al. ................ | 438/270 |
| 2008/0185569 A1 | 8/2008 | Park et al. | |
| 2009/0189137 A1 * | 7/2009 | Kinoshita et al. ............... | 257/2 |
| 2009/0310425 A1 | 12/2009 | Sim et al. | |
| 2010/0163968 A1 | 7/2010 | Kim et al. | |
| 2010/0213527 A1 | 8/2010 | Shim et al. | |
| 2011/0001114 A1 | 1/2011 | Zanderighi et al. | |

FOREIGN PATENT DOCUMENTS

| | | |
|---|---|---|
| JP | 2011-014909 A | 1/2011 |
| KR | 10-2008-0073918 A | 8/2008 |
| KR | 10-2010-0052304 A | 5/2010 |
| KR | 10-2011-0002436 A | 1/2011 |

* cited by examiner

*Primary Examiner* — Zandra Smith
*Assistant Examiner* — Paul Patton
(74) *Attorney, Agent, or Firm* — Lee & Morse, P.C.

(57) ABSTRACT

A memory device includes a lower interconnection in a semiconductor substrate, the lower interconnection being made of a material different from the semiconductor substrate, a selection element on the lower interconnection, and a memory element on the selection element.

27 Claims, 25 Drawing Sheets

METHODS OF MANUFACTURING SEMICONDUCTOR DEVICES

CROSS-REFERENCE TO RELATED APPLICATIONS

This is a divisional application based on pending application Ser. No. 13/463,244, filed May 3, 2012, the entire contents of which is hereby incorporated by reference.

Korean Patent Application No. 10-2011-0054447, filed on Jun. 7, 2011, in the Korean Intellectual Property Office, and entitled: "Semiconductor Devices and Methods of Manufacturing the Same," is incorporated by reference herein in its entirety.

BACKGROUND

1. Field

The present disclosure herein relates to semiconductor devices and methods of manufacturing the same and, more particularly, to semiconductor devices having improved integration density and methods of manufacturing the same.

2. Description of the Related Art

In general, semiconductor devices may be typically categorized as either volatile memory devices or nonvolatile memory devices. The volatile memory devices lose their stored data when their power supplies are interrupted. For example, the volatile memory devices may include dynamic random access memory (DRAM) devices and static random access memory (SRAM) devices. In contrast, the nonvolatile memory devices retain their stored data even when their power supplies are interrupted. The nonvolatile memory devices may include programmable read only memory (PROM) devices, erasable programmable read only memory (EPROM) devices, electrically erasable programmable read only memory (EEPROM) devices, flash memory devices and etc.

Highly integrated semiconductor devices have been increasingly demanded with development of the electronic industry. However, in the event that the semiconductor devices become highly integrated using general scaling down rules, various problems may occur. For example, as a minimum feature size (e.g., a minimum line width) of the semiconductor device is reduced to several tens of nanometers, a process margin in fabrication of the semiconductor devices has been gradually decreased. Further, it may be more difficult to optimize characteristics of various discrete elements in the semiconductor device (e.g., diverse driving circuits and/or memory cells in the semiconductor device) when the minimum feature size of the semiconductor device is continuously reduced.

SUMMARY

At least one embodiment is directed to providing a memory device. The memory device may include a lower interconnection in a semiconductor substrate, the lower interconnection being made of a material different from the semiconductor substrate, a selection element on the lower interconnection, and a memory element on the selection element.

The lower interconnection may include a metallic material.

A surface of the selection element facing the lower interconnection may be nonplanar, e.g., may be sloped.

The lower interconnection may be in direct contact with an entirety of the surface of the selection element facing the lower interconnection.

The selection element may include a semiconductor pillar.

The semiconductor pillar may include an upper impurity region of a first conductivity type and a lower impurity region of a second conductivity type.

The lower impurity region may include a heavily doped impurity region and a lightly doped impurity region between the heavily doped impurity region and the upper impurity region.

The lower interconnection may include a metallic material.

The heavily doped impurity regions of the semiconductor pillar may be in direct contact with the lower interconnection.

The lower interconnection may include a first portion contacting the semiconductor pillar and a second portion extending from the first portion, a thickness of the first portion being different from that of at least part of the second portion.

The at least part of the second portion is thicker than the first portion.

The memory device may include insulating sidewall spacers on sidewalls of the semiconductor pillars, wherein at least part of the second portion extends upwardly between adjacent sidewall spacers.

The semiconductor substrate may include a first region having the memory elements and a second region, wherein top surfaces of the semiconductor pillars are coplanar with a top surface of the semiconductor substrate of the second region.

Each of the lower interconnections includes a first portion contacting the selection element and second portions between adjacent first portions, a thickness of the first portion being different from that of at least part of the second portions.

The at least part of the second portion may be thicker than the first portion.

The at least part of the second portion may include a void. The memory device may include another conductive material filling the void.

A bottom surface of the second portion may be triangular.

Top and bottom surfaces of the second portion may be rounded.

Top and bottom surfaces of the second portion may be sloped with a central flat portion.

The memory elements may employ variable resistors.

The selection element may be a diode, e.g., a PN diode.

At least one embodiment is directed to providing a method of forming a semiconductor device. The method may include forming semiconductor pillars between isolation layers on a semiconductor substrate, forming undercut regions in the semiconductor substrate and under the semiconductor pillars, and forming lower interconnections in the undercut regions between the isolation layers and below the semiconductor pillars.

Forming semiconductor pillars may include etching the semiconductor substrate.

Forming semiconductor pillars may include using a selective epitaxial growth technique.

The method may further include forming an upper impurity region of a first conductivity type in the semiconductor pillars and forming a lower impurity region of a second conductivity type in the semiconductor pillars.

The method may further include forming a heavily doped impurity region in the lower impurity region, the heavily doped impurity region being spaced apart from the upper impurity region.

Forming the heavily doped impurity region may include forming recessed regions in the semiconductor substrate under openings between adjacent semiconductor pillars and doping the semiconductor substrate exposed by the recessed regions.

Forming undercut regions may include etching the semiconductor substrate exposed by the recessed regions.

Etching the semiconductor substrate may include anisotropic etching.

Forming the undercut regions may include forming first undercut regions under the semiconductor pillar and second undercut regions between adjacent first undercut regions, the second undercut regions being wider than the first undercut regions.

Forming lower interconnections in the undercut regions may include depositing a material different from the semiconductor substrate.

Depositing the material may include covering exposed regions of the semiconductor pillars.

Depositing the material may include conformally depositing the material.

Conformally depositing the material may include conformally depositing the material to a thickness such that voids are formed in the second undercut regions.

The method may further include filling the voids with another conductive material.

Depositing the material may include filling the undercut regions with the material.

Forming second undercut regions may include etching the semiconductor substrate to have a plurality of triangular shapes.

Forming second undercut regions may include etching the semiconductor substrate to have a plurality of sloped shapes with a central flat portion.

Forming lower interconnections in the undercut regions may include depositing a material different from the semiconductor substrate.

The material may include a metallic material.

Depositing the material may include covering exposed regions of the semiconductor pillars.

The method may include forming memory elements on the semiconductor pillars.

The memory elements may employ variable resistors.

The semiconductor substrate may include a first region having the memory elements and a second region, wherein top surfaces of the semiconductor pillars are coplanar with a top surface of the semiconductor substrate of the second region.

At least one embodiment is directed to providing a memory device, The memory device may include lower interconnections in a semiconductor substrate, selection elements on the lower interconnections, surfaces of the selection elements facing the lower interconnections being nonplanar, and memory elements on the selection elements.

The lower interconnections may cover the nonplanar surfaces of the selection elements facing the lower interconnections.

At least one embodiment is directed to providing a method of forming a memory device. The method may include forming selection elements in a semiconductor substrate, forming lower interconnections in the semiconductor substrate and under the selection elements, the lower interconnections being made of a material different from the semiconductor substrate, and forming memory elements on the selection elements.

Forming selection elements may include etching the semiconductor substrate.

Forming selection elements may include using a selective epitaxial growth technique.

The material may include a metal.

BRIEF DESCRIPTION OF THE DRAWINGS

Features will become more apparent to those of ordinary skill in the art by describing in detail exemplary embodiments with reference to the attached drawings, in which.

DETAILED DESCRIPTION

Figure 1:
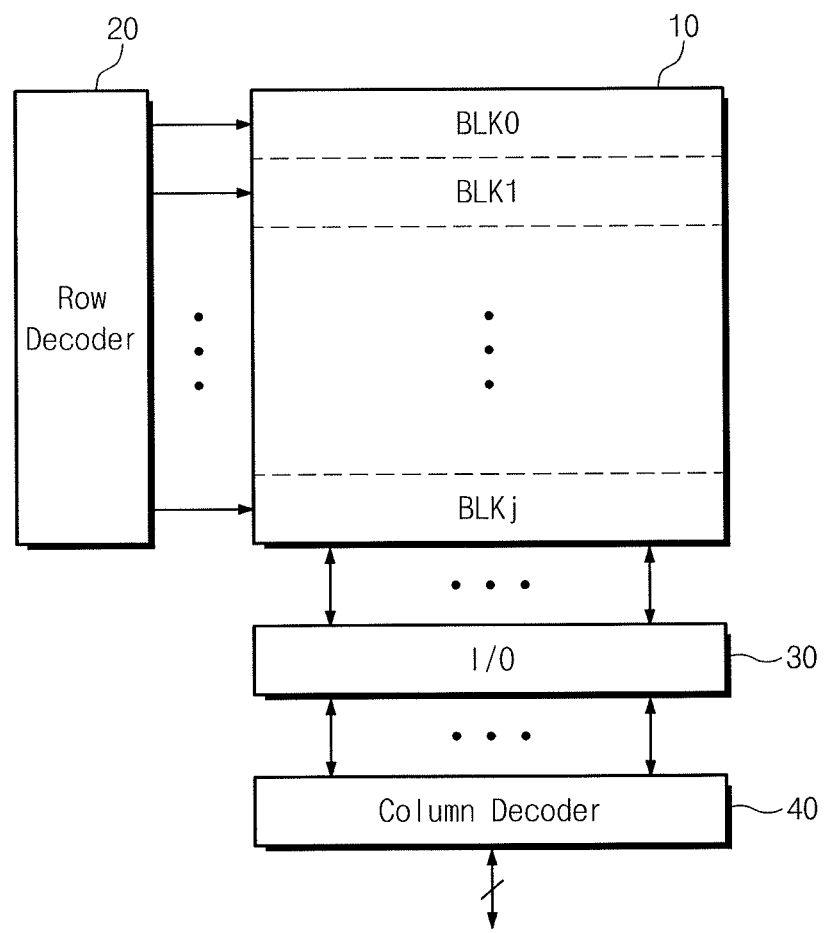
FIG. 1 illustrates a block diagram of a semiconductor device according to an embodiment.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly. As used herein, "height" refers to a direction that is generally orthogonal to the faces of a substrate.

Hereinafter, although the semiconductor devices according to embodiments of the inventive concept are described in conjunction with phase changeable random access memory (PRAM) devices, the inventive concept may be equally applicable to memory devices employing variable resistors, for example, resistive RAM (RRAM) devices, magnetic RAM (MRAM) devices, or ferroelectric RAM (FRAM) devices. Further, the inventive concept may be applicable to dynamic RAM (DRAM) devices, static RAM (SRAM) devices, programmable ROM (PROM) devices, erasable PROM (EPROM) devices, electrically EPROM (EEPROM) devices, or flash memory devices.

FIG. 1 illustrates a block diagram of a semiconductor device according to an embodiment of the inventive concept. Referring to FIG. 1, a semiconductor device according to an embodiment of the inventive concept may include a memory cell array 10 and peripheral circuits controlling memory cells in the memory cell array 10.

The memory cell array 10 may include a plurality of memory blocks BLK0, . . . and BLKj, and each of the memory blocks BLK0, . . . and BLKj may include a plurality of word lines, a plurality of bit lines and a plurality of memory cells. The memory cell array 10 may store data.

The peripheral circuits controlling the memory cells may include a row decoder 20, a data input/output (I/O) circuit 30, and a column decoder 40. The row decoder 20 may select one of the memory blocks BLK0, . . . and BLKj and one of the word lines of the selected memory block BLK0, . . . or BLKj in response to address information (e.g., input signals of the row decoder 20). The data I/O circuit 30 may transfer information data into the memory cell array 10 to write the information data or transfer information data stored in the memory cell array 10 to output pads to read the information data, according to an operation mode. The column decoder 40 may generate signals for selecting at least one of the bit lines of the selected memory block BLK0, . . . or BLKj, and may provide a data transmission path between the data I/O circuit 30 and an external device (for example, a memory controller). The peripheral circuits may further include a logic circuit and/or a voltage generator.

Figure 2:
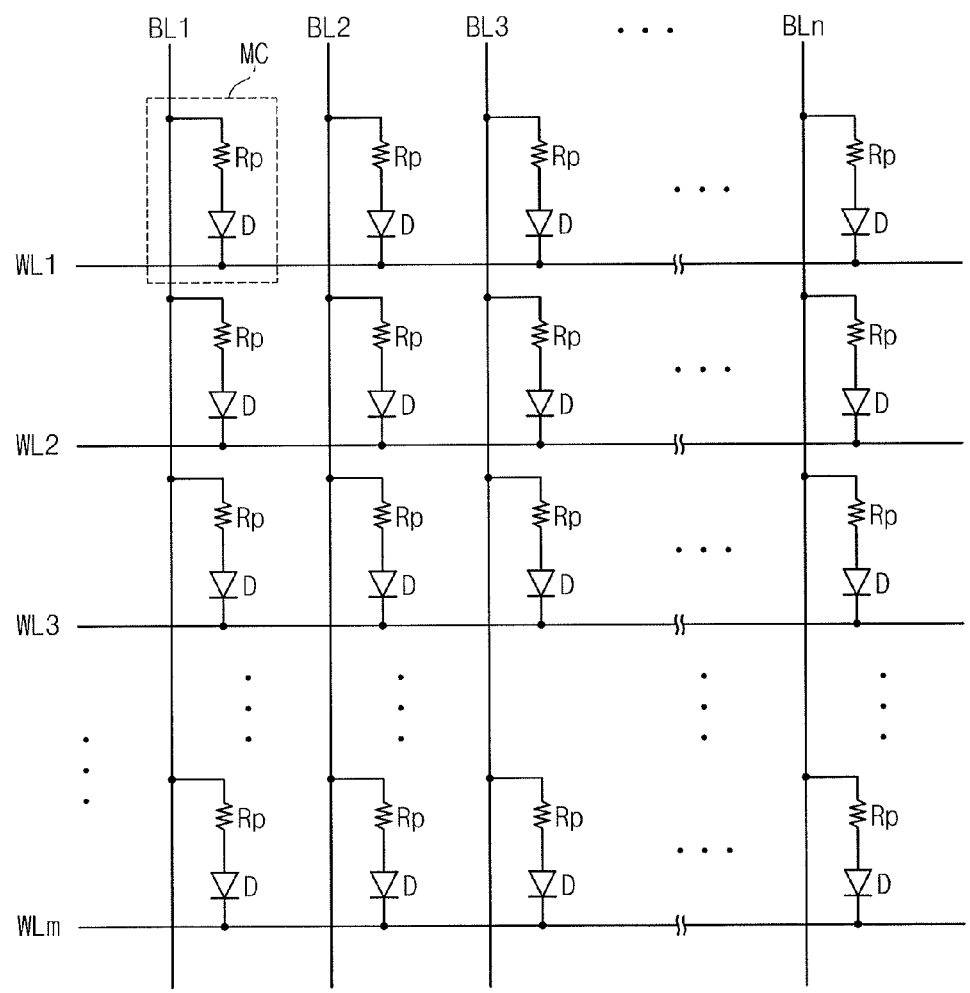
FIG. 2 illustrates a schematic circuit diagram of a memory cell array of a semiconductor device according to an embodiment.

FIG. 2 illustrates a schematic circuit diagram of a memory cell array of a semiconductor device according to an embodiment of the inventive concept.

Referring to FIG. 2, the memory cell array may include a plurality of word lines WL1, . . . and WLm, a plurality of bit lines BL1, . . . and BLn, and a plurality of memory cells MC. The memory cells MC may be disposed at intersections of the word lines WL1, . . . and WLm and the bit lines BL1, . . . and BLn, respectively.

In an embodiment, each of the memory cells MC may include a memory element Rp and a selection element D that are serially connected to each other. That is, a first end of the respective memory elements Rp may be connected to one of the bit lines BL1, . . . and BLn, and a second end of the respective memory elements Rp may be connected to one of the selection elements D. Further, a first end of the respective selection elements D may be connected to one of the word lines WL1, . . . and WLm, and a second end of the respective selection elements D may be connected to one of the memory elements Rp.

In an embodiment, each of the memory elements Rp may correspond to a variable resistive element that can be changed or switched into any one of at least two different resistive states according to an electrical pulse signal applied to the memory element Rp. For example, the variable resistive element may include a phase changeable material. The phase changeable material may include a two element compound material (e.g., a binary element compound material), a three element compound material (e.g., a ternary element compound material), a four element compound material, and so forth. The two element compound material may include a GaSb layer, an InSb layer, an InSe layer, a $Sb_2Te_3$ layer, or a GeTe layer. The three element compound material may include a GeSbTe layer, a GaSeTe layer, a InSbTe layer, a $SnSb_2Te_4$ layer, or a InSbGe layer. The four element compound material may include a AgInSbTe layer, a (GeSn)SbTe layer, a GeSb(SeTe) layer, or a $Te_{81}Ge_{15}Sb_2S_2$ layer.

The phase changeable material may have an amorphous state showing a relatively high electrical resistance or a poly or single crystalline state showing a relatively low electrical resistance according to a temperature thereof. The crystalline phase of the phase changeable material may be transformed by Joule heating generated due to a current that flows through the phase changeable material. The amount of Joule heating generated may be in proportion to resistivity of the phase changeable material and supply time of the current flowing through the phase changeable material. Thus, a writing operation and a reading operation of the PRAM device may be achieved using the phase changeable phenomenon that occurs due to the Joule heating.

In another embodiment, the memory element Rp may include a perovskite compound material, a transition metal oxide material, a magnetic material, a ferromagnetic material, or an anti-ferromagnetic material, instead of the phase changeable material.

The selection element D may be electrically connected to one of the word lines WL1, . . . and WLm. The selection element D may control supply of a current which is forced into the memory element Rp. In an embodiment, the selection element D may be a PN junction diode or a PIN junction diode. The diode may have an anode and a cathode. The anode and the cathode of the diode may be electrically connected to one of the memory elements Rp and one of the word lines WL1, . . . and WLm, respectively. If a forward bias higher than a threshold voltage of the diode is applied to the diode, the diode may be turned on to supply a current (e.g., a programming or writing current) into the memory element Rp.

Figure 3:
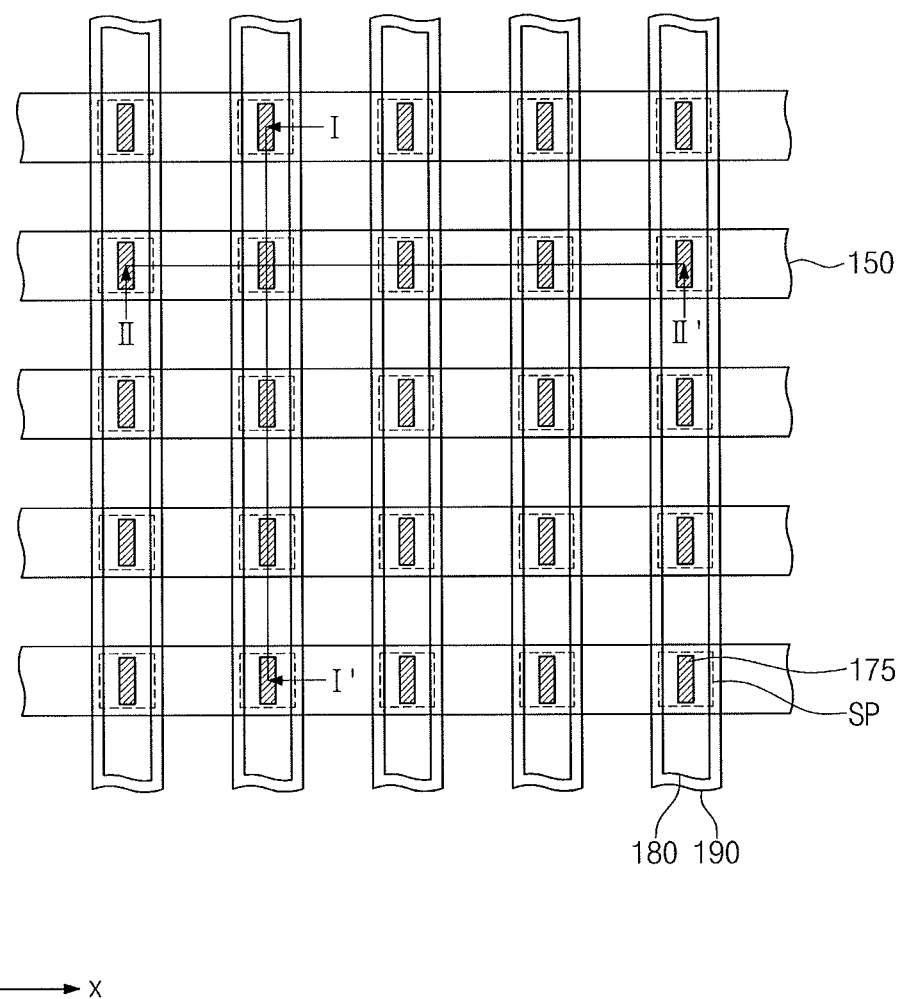
FIG. 3 illustrates a plan view of a cell array region of a semiconductor device according to an embodiment.
Figure 4:
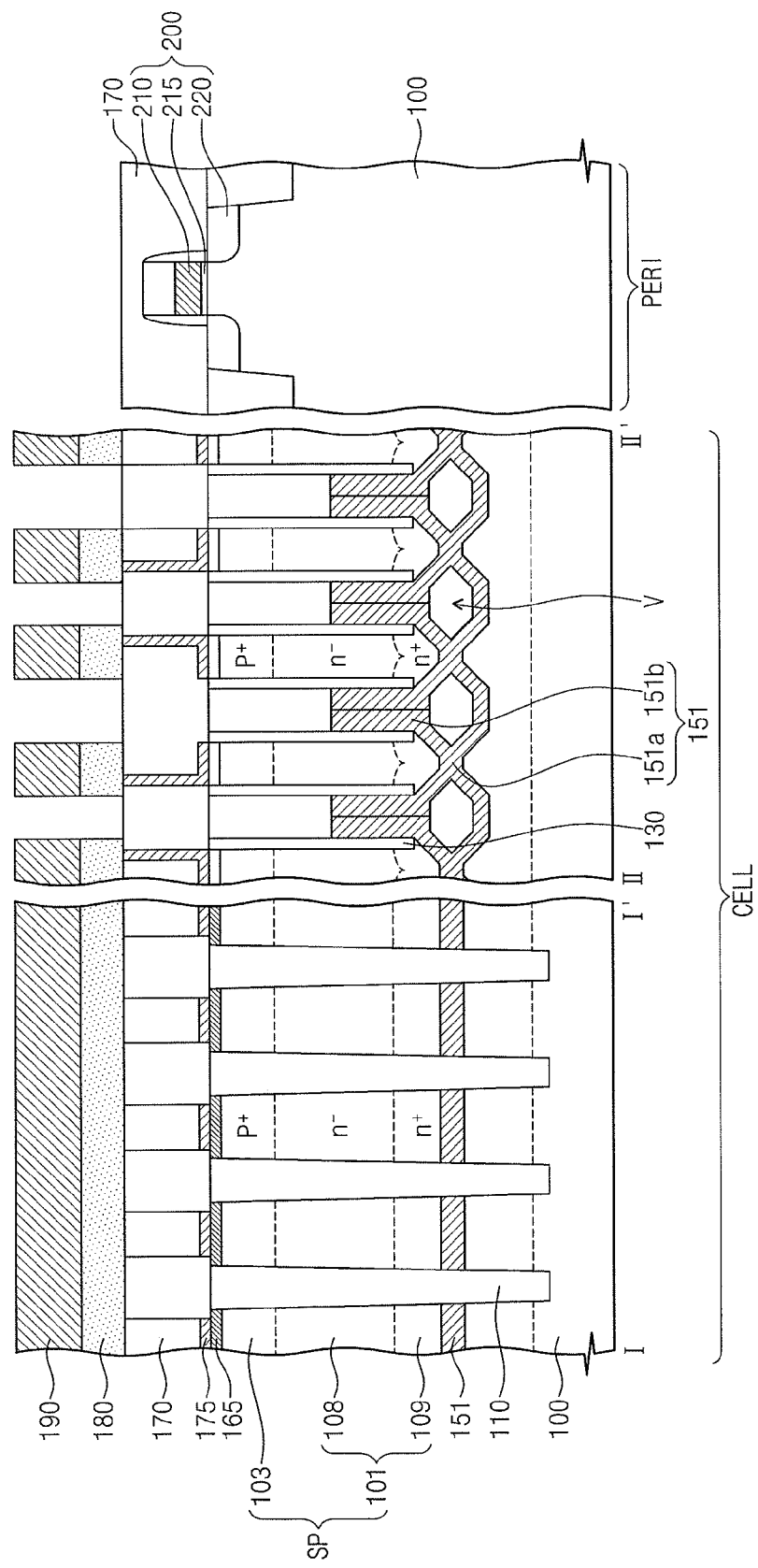
FIG. 4 illustrates a cross sectional view taken along lines I-I' and II-II' of FIG. 3 to illustrate a cell array region and a peripheral circuit region of a semiconductor device according to an embodiment.
Figure 5:
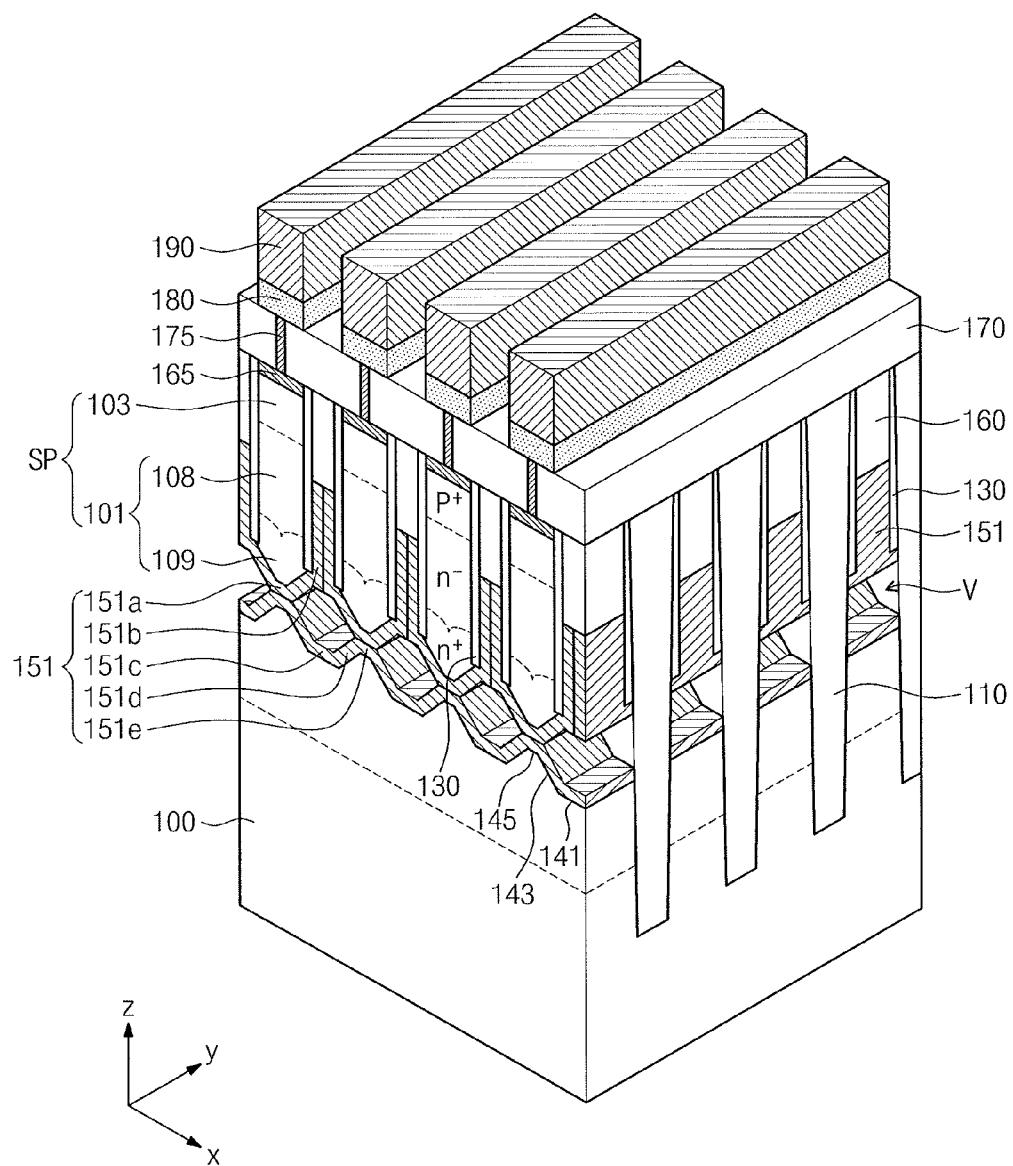
FIG. 5 illustrates a perspective view of a cell array region of a semiconductor device according to an embodiment.

FIG. 3 illustrates a generic plan view of a cell array region of a semiconductor device according to an embodiment. FIG. 4 illustrates a cross sectional view taken along lines I-I' and II-II' of FIG. 3 to illustrate a cell array region and a peripheral circuit region of a semiconductor device according to an embodiment. FIG. 5 illustrates a perspective view of a cell array region of a semiconductor device according to an embodiment.

Referring to FIGS. 3 to 5, a semiconductor substrate 100 may be provided, and the semiconductor substrate 100 may include a cell array region CELL and a peripheral circuit region PERI. Hereinafter, the semiconductor substrate 100 may be referred to as a substrate. FIGS. 4 and 5 illustrate cross-sections according to embodiments.

Referring to FIG. 3, a semiconductor device according to an embodiment may include lower interconnections 150 (corresponding to the word lines WL1, . . . and WLm of FIG. 2) arrayed on the substrate 100 of the cell array region CELL, upper interconnections 190 (corresponding to the bit lines BL1, . . . and BLn of FIG. 2) crossing over the lower interconnections 150, and semiconductor pillars SP respectively disposed at intersections of the lower interconnections 150 and the upper interconnections 190. A plurality of memory elements 180 may be disposed between the semiconductor pillars SP and the upper interconnections 190, respectively. A top portion and a bottom portion of each memory cell 180 may be electrically connected to at least one of the upper interconnections 190 and at least one of the semiconductor pillars SP, respectively.

Lower electrodes 175, memory elements 180, and upper interconnections 190 may be disposed on the substrate having the semiconductor pillars SP. The upper interconnections 190 may cross over the lower interconnections 150, and the memory elements 180 may be respectively disposed in current paths between the upper interconnections 190 and the lower interconnections 150. The lower interconnections 150 may be disposed between the substrate 100 and the semiconductor pillars SP. In an embodiment, the lower interconnections 150 may extend in a first direction (e.g., an X-axis direction). In this case, each of the lower interconnections 150 may be electrically connected to a set of the semiconductor pillars SP which are arrayed in the first direction.

Each of the lower interconnections 150 may include at least one of a titanium nitride (TiN) layer, a tantalum nitride (TaN) layer, a tungsten nitride (WN) layer, a molybdenum nitride (MoN) layer, a niobium nitride (NbN) layer, a TiSiN layer, a TiAlN layer, a TiBN layer, a ZrSiN layer, a WSiN layer, a WBN layer, a ZrAlN layer, a MoSiN layer, a MoAlN layer, a TaSiN layer, a TaAlN layer, a titanium (Ti) layer, a tungsten (W) layer, a molybdenum (Mo) layer, a tantalum (Ta) layer, a titanium silicide (TiSi) layer, a tantalum silicide (TaSi) layer, a titanium oxynitride (TiON) layer, a TiAlON layer, a tungsten oxynitride (WON) layer, a tantalum oxynitride (TaON) layer and a group of conductive carbon-based compound layers. As such, since the lower interconnections 150 include a metallic material, increase of electrical resistance of the lower interconnections 150 may be suppressed even though the semiconductor device including the lower interconnections 150 is scaled down.

Referring to FIG. 4, the semiconductor device may further include peripheral circuits disposed on the substrate 100 of the peripheral circuit region PERI. The peripheral circuits may include the row decoder 20, the data I/O circuit 30, and the column decoder 40 described with reference to FIG. 1. For example, the peripheral circuit region PERI may include MOS transistors. Each of the MOS transistors in the peripheral circuit region PERI may include a gate electrode 210 disposed on the substrate 100, a gate insulation layer 215 disposed between the gate electrode 210 and the substrate 100, and source/drain impurity regions 220 respectively disposed in the substrate 100 at both sides of the gate electrode 210.

Specifically, the semiconductor substrate 100 may correspond to a single crystalline silicon substrate. Alternatively, the semiconductor substrate 100 may correspond to a silicon-on-insulator (SOI) substrate, a germanium substrate, a germanium-on-insulator (GOI) substrate, a silicon-germanium substrate, or an epitaxial layered substrate formed using a selective epitaxial growth (SEG) technique.

In an embodiment, the semiconductor substrate 100 may be formed of a single crystalline semiconductor material. In the single crystalline semiconductor material, all the lattice directions and all the lattice planes may be expressed using a mathematical description relating to Miller index. That is, the semiconductor substrate 100 (referred to as a semiconductor wafer) may include a main surface having one of a family of equivalent crystal planes of the single crystalline semiconductor material constituting the semiconductor wafer.

In an embodiment, the semiconductor device may be realized on the main surface having one of the family of equivalent crystal planes. For example, the semiconductor device may be realized on a main surface having a plane orientation of (100) of a single crystalline silicon substrate. Alternatively, the semiconductor device may be realized on a main surface having a plane orientation of (110) of a single crystalline silicon substrate.

In an embodiment, a plurality of isolation layers 110 may be disposed in the substrate 100 and the isolation layers 110 may extend in the first direction (e.g., X-axis direction). That is, the isolation layers 110 may be arrayed to be spaced apart from each other in a second direction (e.g., Y-axis direction) crossing the first direction. The isolation layers 110 may have a line shape in a plan view. A lower width of each isolation layer 110 may be less than an upper width thereof The upper width of the isolation layers 110 may be substantially equal to a space between the isolation layers 110. The isolation layers 110 may be formed of an insulation material such as an oxide material and/or a nitride material.

In an embodiment, the semiconductor pillars SP may include a single crystalline semiconductor material and may correspond to portions of the substrate 100. The semiconductor pillars SP may be disposed between the line shaped isolation layers 110. Thus, the semiconductor pillars SP between two adjacent one of the isolation layers 110 may be arrayed to be spaced apart from each other in the first direction (X-axis direction). The semiconductor pillars SP may include first sidewalls directly contacting the isolation layers 110 and second sidewalls which are perpendicular to the first sidewalls. The second sidewalls of the semiconductor pillars SP may be covered with sidewall spacers 130 formed of an insulation material. Further, each of the semiconductor pillars SP may include a flat top surface and a nonplanar, e.g., sloped, bottom surface.

In detail, the top surface of the respective semiconductor pillars SP may include a (100) plane, and the bottom surface of the respective semiconductor pillars SP may include a (111) plane, a (211) plane, or a (311) plane. Alternatively, the top surface of the respective semiconductor pillars SP may include a (110) plane, and the bottom surface of the respective semiconductor pillars SP may include a rounded shape. The semiconductor pillars SP in the cell array region CELL may correspond to portions of the semiconductor substrate 100. Thus, the top surfaces of the semiconductor pillars SP may be coplanar with a top surface of the semiconductor substrate 100 in the peripheral circuit region PERI.

In an embodiment, each of the semiconductor pillars SP may include a lower impurity region 101 and an upper impurity region 103 having an opposite conductivity type to the lower impurity region 101. That is, the lower impurity region 101 may be doped with impurities of a first conductivity type, and the upper impurity region 103 may be doped with impurities of a second conductivity type opposite to the first conductivity type. For example, the lower impurity region 101 may correspond to an N-type impurity region, and the upper impurity region 103 may correspond to a P-type impurity region. As such, each of the semiconductor pillars SP may be a PN junction diode. Alternatively, each of the semiconductor pillars SP may further include an intrinsic region between the P-type impurity region and the N-type impurity region. That is, each semiconductor pillar SP may correspond to a PIN junction diode.

In an embodiment, the lower impurity region 101 having the first conductivity type may include a lower lightly doped impurity region 108 contacting the upper impurity region 103 and a lower heavily doped impurity region 109 contacting the lower interconnection 150. For example, the lower lightly doped impurity region 108 may have an impurity concentration of about $1\times10^{14}$ atoms/cm$^3$ to about $1\times10^{17}$ atoms/cm$^3$, and the lower heavily doped impurity region 109 may have an impurity concentration of about $1\times10^{17}$ atoms/cm$^3$ to about $1\times10^{21}$ atoms/cm$^3$. In some embodiments, the lower heavily doped impurity regions 109 may be in direct contact with the lower interconnections 150 formed of a metallic material. In this case, an energy barrier (e.g., a Schottky barrier) between the lower heavily doped impurity regions 109 formed of a semiconductor material and the lower interconnections 150 formed of a metallic material, which are in direct contact with each other, may be lowered to reduce contact resistance between the lower interconnections 150 and the lower heavily doped impurity regions 109.

In an embodiment, a doping concentration of the upper impurity regions 103 doped with P-type impurities may be higher than that of the lower lightly doped impurity regions 108 doped with N-type impurities. For example, the upper impurity regions 103 doped with P-type impurities may have an impurity concentration of about $1\times10^{17}$ atoms/cm$^3$ to about $1\times10^{21}$ atoms/cm$^3$, and the lower lightly doped impurity region 108 doped with N-type impurities may have an impurity concentration of about $1\times10^{14}$ atoms/cm$^3$ to about $1\times10^{17}$ atoms/cm$^3$. Thus, a leakage current flowing through any one selected from the semiconductor diodes may be reduced even when a reverse bias is applied to the selected diode.

As described above, the semiconductor diodes acting as the selection elements D may control current flow that passes through the memory elements Rp. Since the semiconductor diodes may be realized in the semiconductor pillars SP corresponding to portions of the single crystalline semiconductor substrate 100, the semiconductor diodes may also have the single crystalline property. Thus, the leakage currents of the semiconductor diodes used as the selection elements D may be remarkably reduced to enhance the reliability of the semiconductor device.

In an embodiment, lower interconnections 150 may be disposed between the semiconductor substrate 100 and the semiconductor pillars SP, and each of the lower interconnections 150 may be electrically connected to the semiconductor diodes formed in the semiconductor pillars SP which are arrayed in the first direction.

In a particular embodiment illustrated in FIGS. 4 and 5, top surfaces of lower interconnections 151 may directly contact the sloped bottom surfaces of the semiconductor pillars SP, and bottom surfaces of the lower interconnections 151 may directly contact the semiconductor substrate 100. In an embodiment, a surface of the semiconductor substrate 100 contacting the lower interconnections 151 may include floor surfaces 141 parallel with top surfaces of the semiconductor pillars SP, sloped surfaces 143 obliquely extended from edges of the floor surfaces 141, and mesa surfaces 145 parallel to the floor surfaces 141 and between upper ends of the sloped surfaces 143. The floor surfaces 141 of the semiconductor substrate 100 may have a (100) plane and the sloped surfaces 143 of the semiconductor substrate 100 may have a (111) plane. Alternatively, the sloped surfaces 143 may have a (211) plane or (311) plane. That is, each of the lower interconnections 151 may contact at least one of the (100) plane, the (111) plane, the (211) plane, and the (311) plane that correspond to the surfaces 141 and 143 of the semiconductor substrate 100. In particular, when each of the lower interconnections 151 is in contact with the sloped surfaces 143 of the semiconductor pillars SP, contact resistance between the lower interconnections 151 and the semiconductor pillars SP (e.g., the semiconductor diodes) may be reduced.

In an embodiment, each of the lower interconnections 151 may include first portions 151a contacting the semiconductor pillars SP, e.g., directly, conformally contacting the semiconductor pillars SP, and second portions 151b between the first portions 151a. Each of the lower interconnections 151 may include third portions 151c on the floor surfaces 141, fourth portions 151d on the sloped surfaces 143, and fifth portions 151e on the mesa surfaces 145. A flat, lower region of the first portions 151a may directly contact the fifth portions 151e.

A vertical thickness (e.g., a distance between a bottom surface and a top surface of the lower interconnection 151) of the lower interconnection 151 may vary according to a position the respective portion of the lower interconnection 151. For example, a vertical thickness of lower interconnection 151 located under the semiconductor pillars SP, e.g., a combined vertical thickness of the first portions 151a and fifth portions 151e, may be less than a vertical thickness lower interconnection 151 located between the semiconductor pillars, as illustrated in FIGS. 4 and 5. Alternatively, as the semiconductor device becomes scaled down, the lower interconnections 151 may have a uniform thickness.

In an embodiment, the second portions 151b of the lower interconnections 151 may upwardly extend into regions between the semiconductor pillars SP. In this case, the extensions of the second portions 151b of the lower interconnections 151 may be insulated from the semiconductor pillars SP by sidewall spacers 130 covering sidewalls of the semiconductor pillars SP. A void V may be locally formed between the second portions 151b and the third and fourth portions 151c and 151d.

Moreover, the lower interconnections 151 may be disposed between the isolation layers 110 and may extend in the first direction. Further, both sidewalls of each of the lower interconnections 151 may directly contact the isolation layers 110. That is, the lower interconnections 151 may be substantially parallel with the isolation layers 110, and a line width of the lower interconnections 151 may be substantially equal to a space between the isolation layers 110.

The lower interconnections 151 may include a metallic material and may directly contact the lower heavily doped impurity regions 109 of the semiconductor pillars SP. In an embodiment, each of the lower interconnections 151 may include at least one of a conductive metal nitride layer, a conductive metal oxynitride layer, a metal layer, and a conductive carbon-based compound layer. In an embodiment, the lower electrodes 175 may have a pillar shape. However, the lower electrodes 175 may be embodied in various forms which are capable of reducing an area of a horizontal section thereof. For example, each of the lower electrodes 175 may have a three dimensional structure such as a U-shaped structure, an L-shaped structure, a hollow cylinder-shaped structure, a ring-shaped structure or a cup-shaped structure.

Ohmic patterns 165 may be disposed between the lower electrodes 175 and the semiconductor pillars SP. The ohmic patterns 165 may reduce the contact resistance between lower electrodes 175 and the semiconductor pillars SP. For example, each of the ohmic patterns 165 may include a metal silicide material, e.g., a titanium silicide layer, a cobalt silicide layer, a tantalum silicide layer or a tungsten silicide layer.

As illustrated in FIGS. 4 and 5, the memory elements 180 may have a line shape to cross over the lower interconnections 151, like the upper interconnections 190. The memory elements 180 may be electrically connected to the semiconductor pillars SP through the lower electrodes 175. Alternatively, the memory elements 180 may be two dimensionally arrayed in rows and columns, like the lower electrodes 175. That is, the memory elements 180 may be disposed on the semiconductor pillars SP, respectively.

In an embodiment, the memory elements 180 may include a phase changeable material containing at least one of tellurium (Te) and selenium (Se) corresponding to chalcogenide elements. For example, each of the memory elements 180 may include a Ge—Sb—Te layer, a As—Sb—Te layer, a As—Ge—Sb—Te layer, a Sn—Sb—Te layer, a Ag—In—Sb—Te layer, a In—Sb—Te layer, a 5A group element-Sb—Te layer, a 6A group element-Sb—Te layer, 5A group element-Sb—Se layer, a 6A group element-Sb—Se layer, a Ge—Sb layer, a In—Sb layer, a Ga—Sb layer, or a doped Ge—Sb—Te layer. The doped Ge—Sb—Te layer may be doped with carbon (C), nitrogen (N), boron (B), bismuth (Bi), silicon (Si), phosphorus (P), aluminum (Al), dysprosium (Dy), or titanium (Ti).

Alternatively, each of the memory elements 180 may include a perovskite compound material, a transition metal oxide material, a magnetic material, a ferromagnetic material, or an anti-ferromagnetic material, instead of the phase changeable material.

FIGS. 6 to 9 illustrate cross sectional views of semiconductor devices according to some embodiments of the inventive concept. Each of FIGS. 6 to 9 include a cross sectional view taken along lines I-I' and II-II' of FIG. 3. Differences between the embodiments of FIGS. 4, 6, 7, 8, and 9 relate to differences between lower interconnections therein, as evidenced by the different reference numerals indicating these lower interconnections. None of the lower interconnections in the embodiments in FIGS. 6 to 9 have voids therein. Other similar elements between the embodiment of FIG. 4 and the embodiments of FIGS. 6 to 9 will not be repeated for clarity. For example, the configuration of the lower interconnections relative to the isolations layers 110 may be the same in all embodiments.

Figure 6:
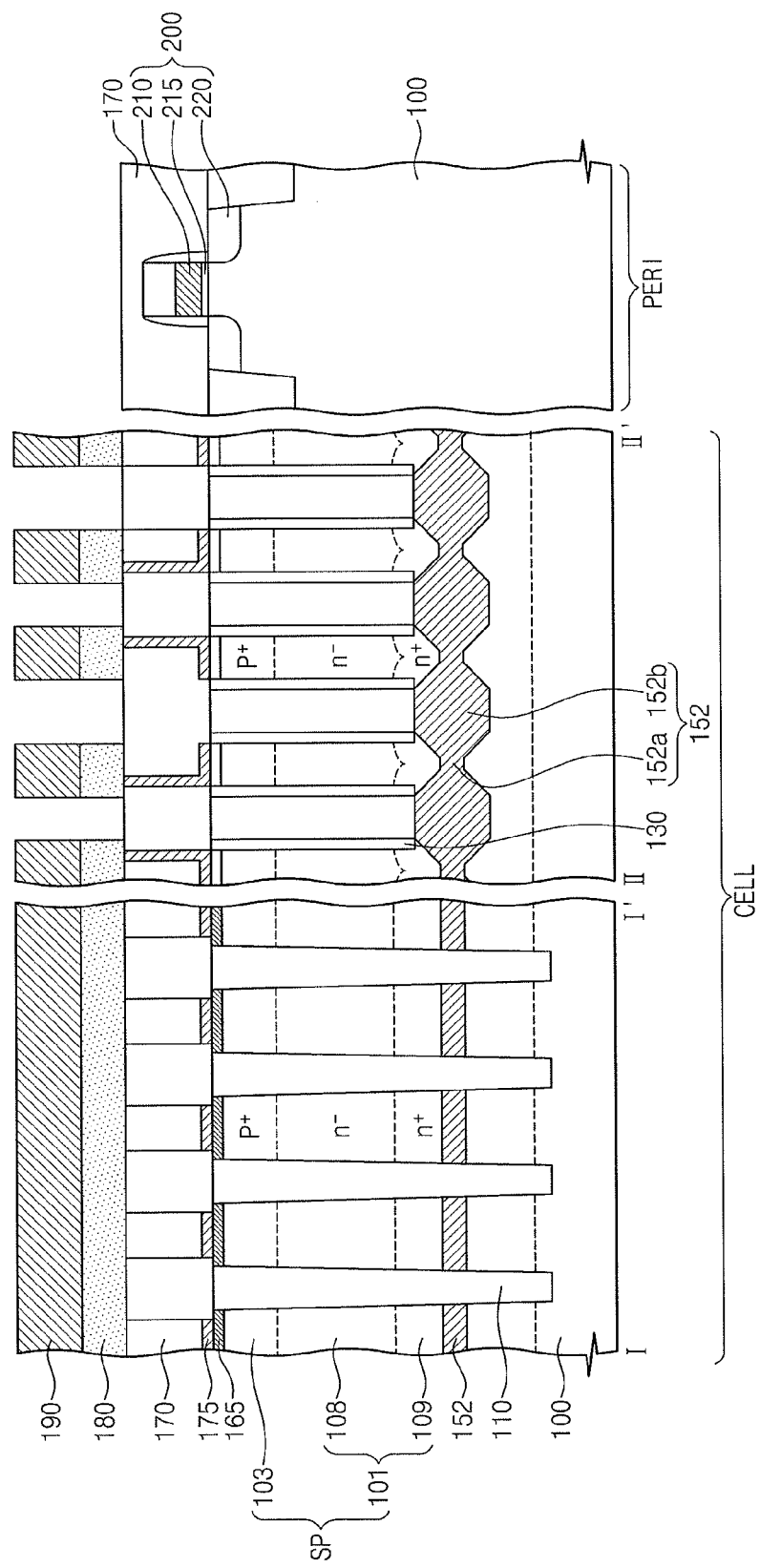
FIGS. 6 to 9 illustrate cross sectional views of semiconductor devices according to some embodiments of the inventive concept, and each of FIGS. 6 to 9 includes cross sectional views taken along lines I-I' and II-II' of FIG. 3.
Figure 7:
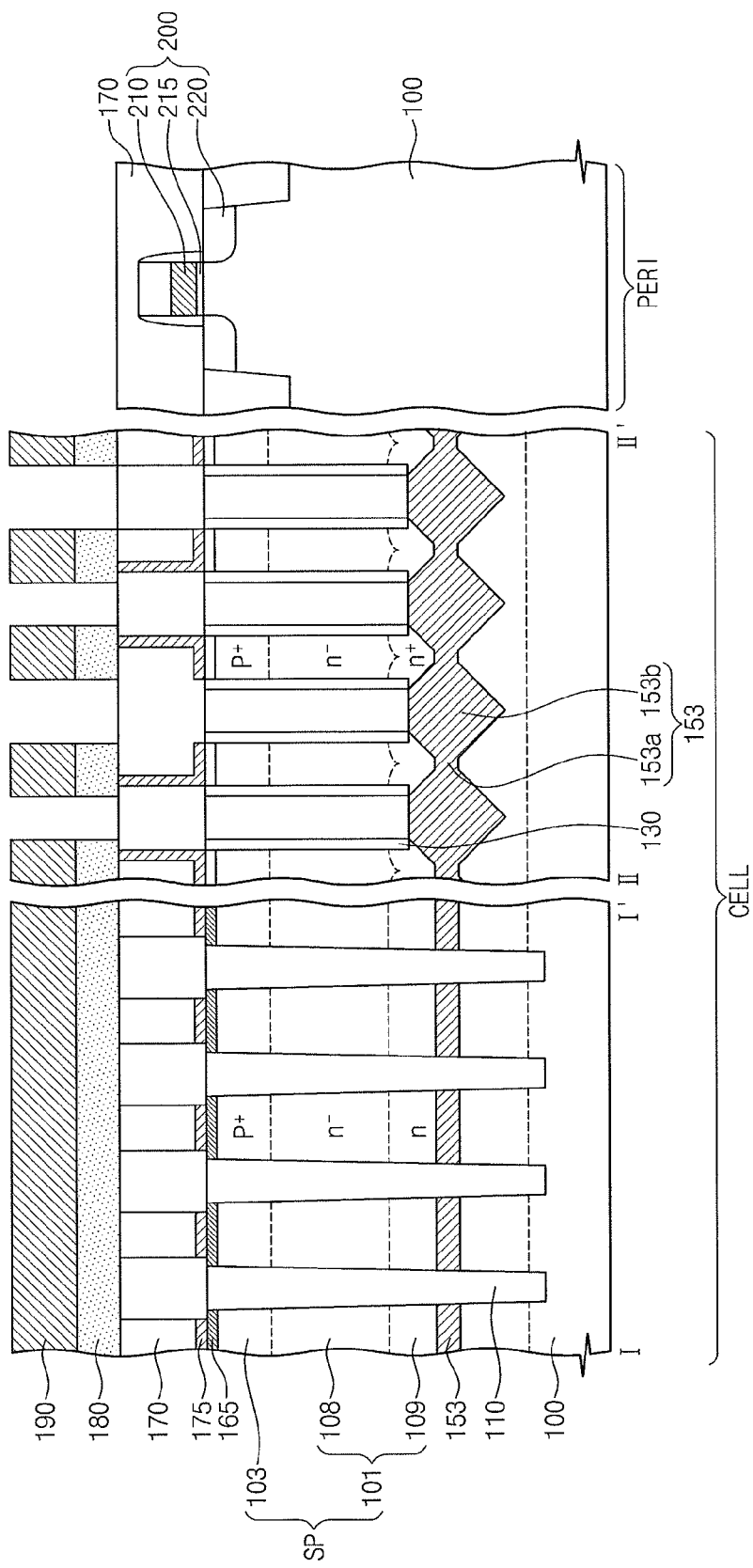
Figure 8:
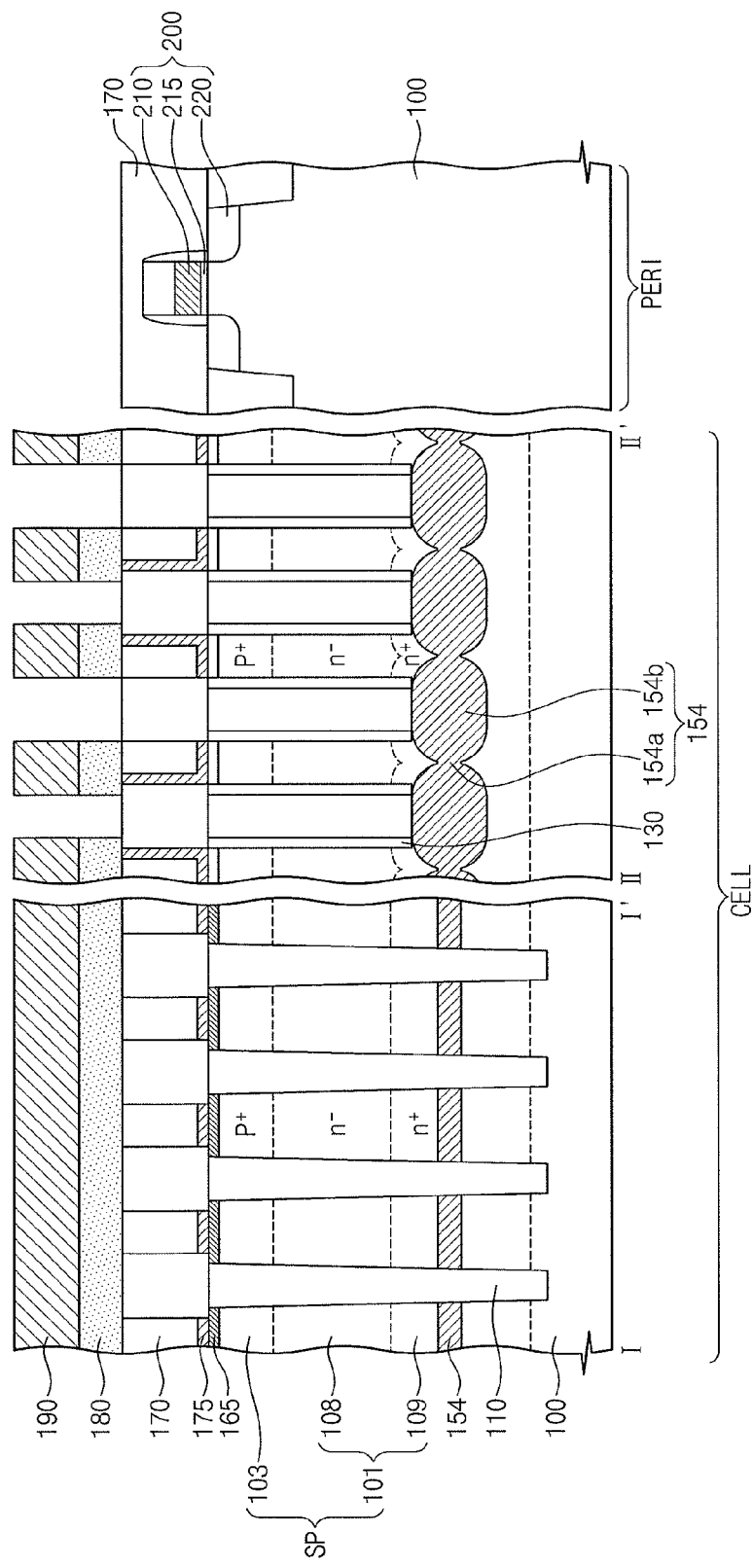

In the embodiments illustrated in FIGS. 6 to 8, each of the semiconductor pillars SP in the cell array region CELL may correspond to a portion of the substrate 100 and may have a top surface of a (100) plane or a (110) plane. The top surfaces of the semiconductor pillars SP may be coplanar with a top surface of the semiconductor substrate 100 in the peripheral circuit region PERI. The top surface of the semiconductor substrate 100 in the peripheral circuit region PERI may also have a (100) plane or a (110) plane. Bottom surfaces of the semiconductor pillars SP may be located at a lower level than the top surface of the semiconductor substrate 100 in the peripheral circuit region PERI.

In the embodiments illustrated in FIGS. 6 and 7, the semiconductor substrate 100 may correspond to a single crystalline silicon substrate having a main surface (e.g., a top surface) of a (100) plane.

In FIG. 6, lower interconnections 152 may contact a (100) plane, a (111) plane, a (211) plane, or a (311) plane of the crystalline silicon substrate. Further, sloped bottom surfaces of the semiconductor pillars SP may have a (111) plane, a (110) plane, a (211) plane or a (311) plane.

Referring to FIG. 6, the lower interconnections 152 in the cell array region CELL may directly contact the bottom surfaces of the semiconductor pillars SP and may extend in the first direction. Each of the lower interconnections 152 may include first portions 152a contacting the semiconductor pillars SP and second portions 152b between the first portions 152a. A vertical thickness of the first portions 152a may be different from a vertical thickness of the second portions 152b. For example, top and bottom surfaces of the second portions 152b may be sloped with a central flat portion, the sloped surfaces joining a minimum thickness of the first portions 152a with a maximum thickness of the second portions 152b.

Referring to FIG. 7, lower interconnections 153 may include first and second portions 153a and 153b having a sharp wedge shape. This is due to the sloped surfaces having the (111) planes of the single crystalline silicon substrate 100. A vertical thickness of the first portions 153a may be different from a thickness of the second portions 153b. For example, a bottom surface of the second portions 153b may be sloped to a point, i.e. have a triangular shape, while a top surface of the second portions 153b may have a central flat portion, the sloped surfaces joining a minimum thickness of the first portions 153a with a maximum thickness of the second portions 153b.

Referring to FIG. 8, the semiconductor substrate 100 may correspond to a single crystalline silicon substrate having a flat top surface of a (110) plane, and each lower interconnection 154 may have rounded top surfaces 154a and rounded bottom surfaces 154b. The rounded bottom surfaces 154b of the lower interconnections 154 may directly contact rounded top surfaces of the semiconductor substrate 100. Each of the rounded top surfaces of the semiconductor substrate 100 may have a recessed shape or a concave shape. A vertical thickness of the first portions 154a may be different from a vertical thickness of the second portions 154b. For example, top and bottom surfaces of the second portions 154b may be rounded with a flat central portion, the rounded sloped surfaces joining a minimum thickness of the first portions 154a with a maximum thickness of the second portions 154b.

Figure 9:
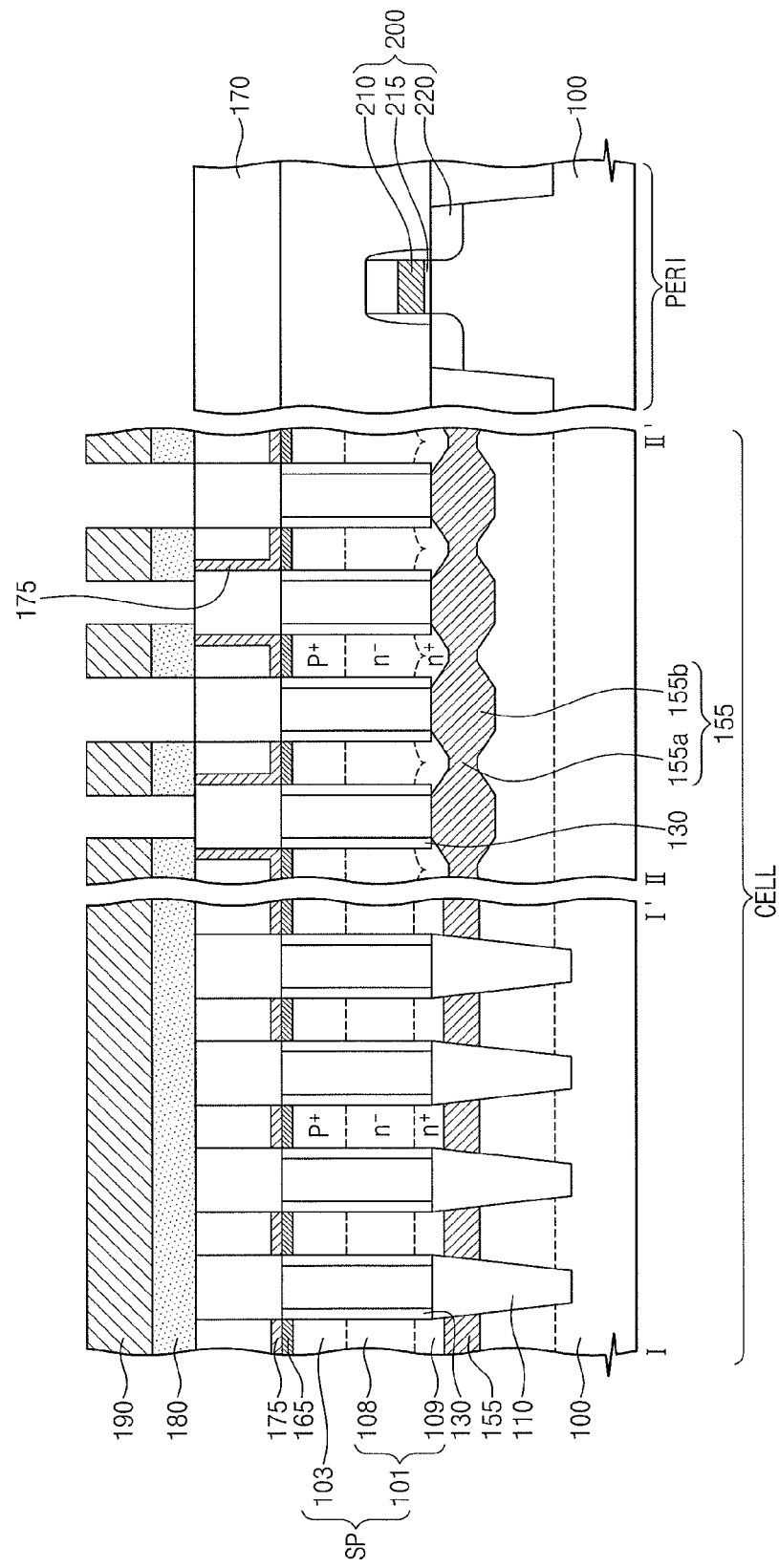

Referring to FIG. 9, the semiconductor pillars SP may correspond to epitaxial layers which are formed on a single crystalline semiconductor substrate 100 using a selective epitaxial growth technique. Semiconductor diodes may be realized in the semiconductor pillars SP formed of the epitaxial layers, and lower interconnections 155 formed of a metallic material may be disposed under the semiconductor diodes, as described with reference to FIGS. 3 to 5. Each of the lower interconnections 155 may include first portions 155a contacting the semiconductor pillars SP and second portions 155b between the first portions 155a. A vertical thickness of the first portions 155a may be different from a vertical thickness of the second portions 155b. For example, top and bottom surfaces of the second portions 155b may be sloped with a central flat portion, the sloped surfaces joining a minimum thickness of the first portions 155a with a maximum thickness of the second portions 155b.

Top surfaces of the semiconductor substrate 100 in the peripheral circuit region PERI may be located at a lower level than top surfaces of the semiconductor pillars SP.

<Fabrication Methods>

Figure 10A:
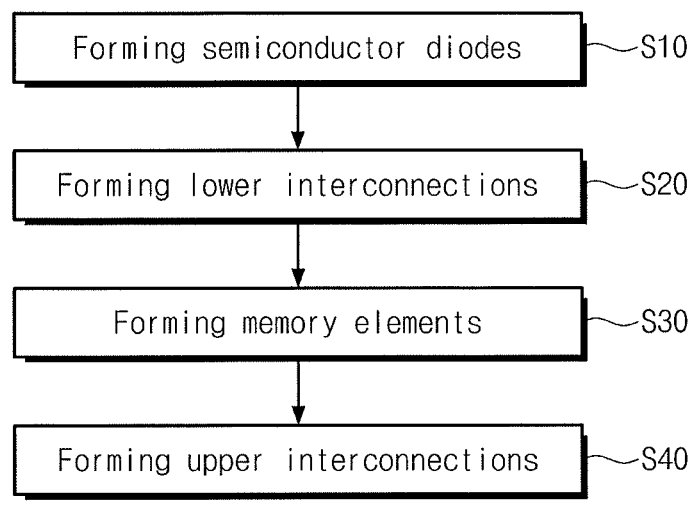
FIGS. 10A and 10B illustrate process flow charts of methods of manufacturing semiconductor devices according to embodiments.
Figure 10B:
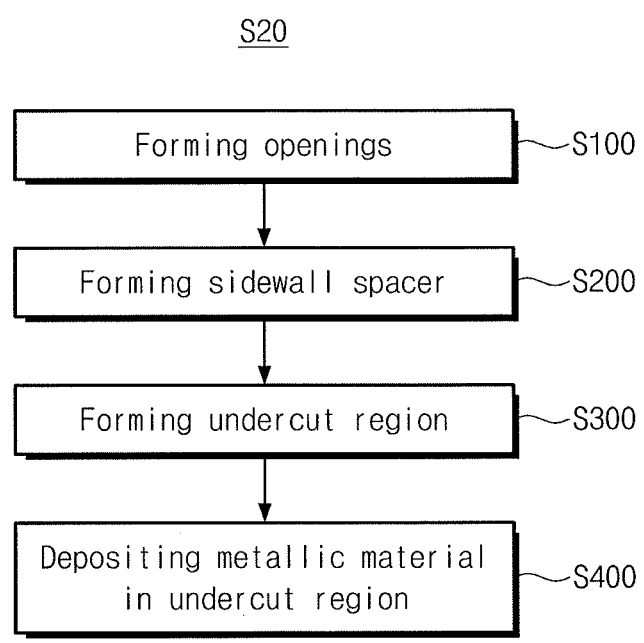

FIGS. 10A and 10B illustrate process flow charts of methods of manufacturing semiconductor devices according to embodiments of the inventive concept.

Referring to FIG. 10A, a method of manufacturing a semiconductor device according to an embodiment of the inventive concept may include forming semiconductor diodes (S10), forming lower interconnections (S20), forming memory elements (S30), and forming upper interconnections (S40).

In an embodiment, each of the semiconductor diodes may include two terminals. One of the two terminals is a P-type semiconductor material and the other is an N-type semiconductor material. For example, the semiconductor diode may be a PN diode including a P-type semiconductor material and a N-type semiconductor material that contact each other to have a metallurgical junction. Alternatively, the semiconductor diode may be a PIN diode that further includes an intrinsic material between the P-type and N-type semiconductor materials.

In an embodiment, the semiconductor diodes may be realized in semiconductor pillars which include a single crystalline semiconductor material (for example, a single crystalline silicon material). The semiconductor pillars may be formed by patterning a single crystalline semiconductor substrate. Alternatively, the semiconductor pillars may be formed using a selective epitaxial growth technique.

Referring to FIG. 10B, forming the lower interconnections (S20) may include forming openings that expose predetermined regions of the semiconductor substrate having the semiconductor pillars (e.g., the semiconductor diodes) (S100), forming sidewall spacers in the openings (S200), forming undercut regions crossing the openings (S300), and forming the lower interconnections in the undercut regions (S400). The lower interconnections may be formed of a metallic material and may be electrically connected to lower portions of the semiconductor diodes. The undercut regions may expose lower portions of the semiconductor pillars, and each of the lower interconnections may be connected to the lower portions of some of the semiconductor pillars.

Memory elements connected to upper portions of the semiconductor pillars may be formed after formation of the lower interconnections, and upper interconnections may be formed on the memory elements. The upper interconnections may be formed to cross over the lower interconnections.

Hereinafter, a method of manufacturing a semiconductor device according to an embodiment of the inventive concept will be described in more detail with reference to FIGS. 11 to 18. FIGS. 11 to 18 illustrate perspective views of stages in a method of manufacturing a semiconductor device according to an embodiment.

Figure 11:
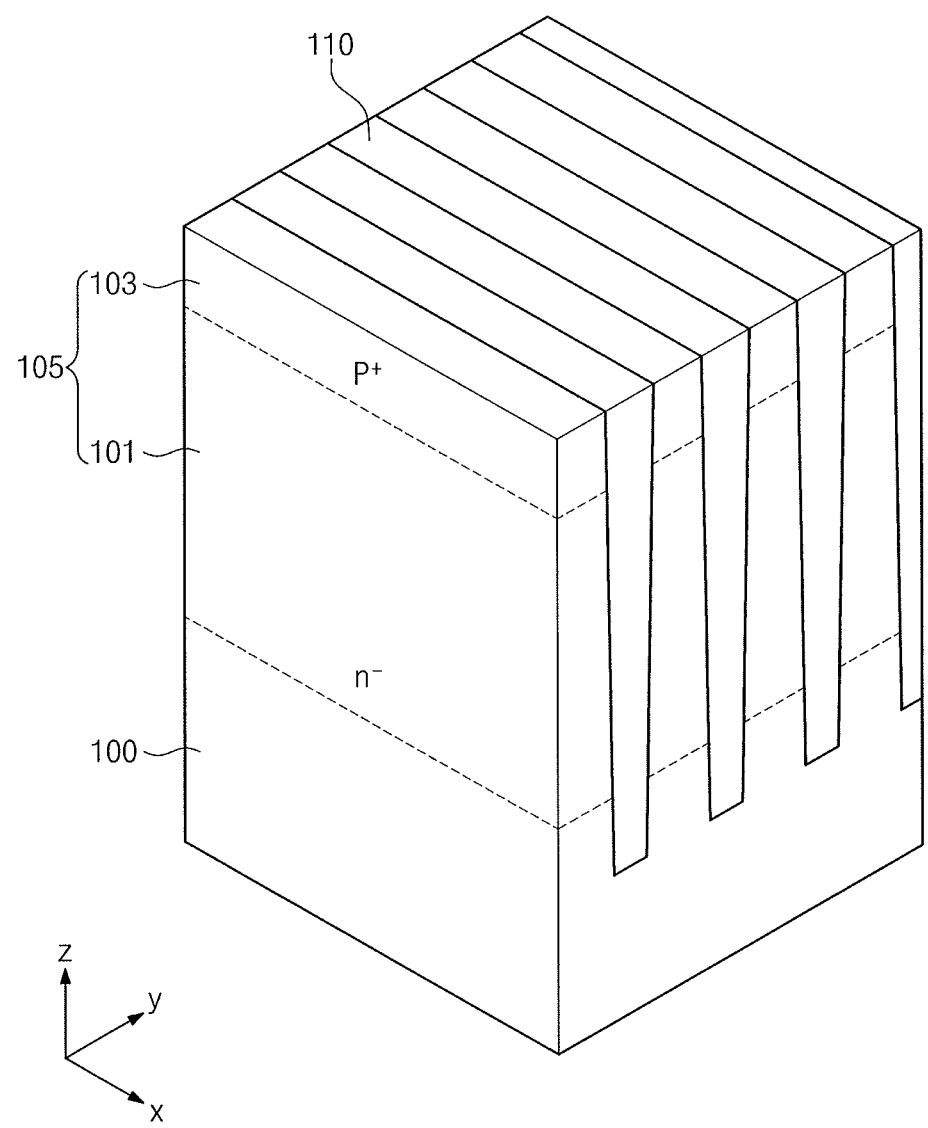
FIGS. 11 to 18 illustrate perspective views in stages of a method of manufacturing a semiconductor device according to an embodiment.

Referring to FIG. 11, isolation layers 110 may be formed in the semiconductor substrate 100. The semiconductor substrate 100 may correspond to a single crystalline silicon substrate. Alternatively, the semiconductor substrate 100 may correspond to a silicon-on-insulator (SOI) substrate, a germanium substrate, a germanium-on-insulator (GOI) substrate, a silicon-germanium substrate, or an epitaxial layered substrate formed using a selective epitaxial growth (SEG) technique.

In an embodiment, the semiconductor substrate 100 may be formed of a single crystalline semiconductor material. The semiconductor substrate 100 may correspond to a wafer including a main surface having one plane orientation of a family of equivalent crystal planes of the single crystalline semiconductor material constituting the semiconductor wafer. For example, the semiconductor substrate 100 may correspond to a single crystalline silicon substrate having a main surface of a (100) plane. Alternatively, the semiconductor substrate 100 may correspond to a single crystalline silicon substrate having a main surface of a (110) plane.

In an embodiment, the isolation layers 110 may be formed in the semiconductor substrate 100 to have a line shape that extends in a first direction (e.g., an X-axis direction). Thus, line patterns 105 may be defined between the isolation layers 110, and the line patterns may also extend in the first direction.

Forming the isolation layers 110 may include forming trenches in the semiconductor substrate 100 and filling the trenches with an insulation material. Specifically, forming the trenches may include forming a mask pattern (not shown) exposing predetermined regions of the semiconductor substrate 100 and anisotropically etching the semiconductor substrate 100 using the mask pattern as an etch mask. In an embodiment, the trenches may be formed to have a line shape extending in the first direction. The trenches may be formed to have a lower width and an upper width, and the lower width of the trenches may be less than the upper width of the trenches because of the nature of the anisotropic etching process.

Filling the trenches with the insulation material may include forming an insulation layer on the substrate having the trenches and planarizing the insulation layer. The insulation layer may be deposited using a deposition technique showing excellent step coverage. The isolation layers 110 may be formed of an insulation material having an excellent gap fill characteristic. For example, the isolation layers 110 may be formed of a boro-phosphor-silicate glass (BPSG) layer, a high density plasma (HDP) oxide layer, an undoped silicate glass (USG) layer, or a tonen silazene (TOSZ) layer.

Before or after forming the isolation layers 110, upper impurity regions 103 and lower impurity regions 101 may be formed in the semiconductor substrate 100. Specifically, the lower impurity regions 101 may have an opposite conductivity type to the upper impurity regions 103. For example, the upper impurity regions 103 may be formed by implanting P-type impurities into the semiconductor substrate 100, and the lower impurity regions 101 may be formed by implanting N-type impurities into the semiconductor substrate 100. In this case, ion implantation energy of the N-type impurities may be higher than that of the P-type impurities. Thus, the upper impurity regions 103 may be formed to contact top surfaces of the lower impurity regions 101. In an embodiment, a vertical thickness (along a Z-axis direction) of the upper impurity regions 103 may be less than that of the lower impurity regions 101.

In an embodiment, a doping concentration of the P-type impurities in the upper impurity regions 103 may be greater than that of the N-type impurities in the lower impurity regions 101. For example, the upper impurity regions 103 may be formed to have a P-type impurity concentration of about $1\times10^{17}$ atoms/cm$^3$ to about $1\times10^{21}$ atoms/cm$^3$, and the lower impurity regions 101 may be formed to have an N-type impurity concentration of about $1\times10^{14}$ atoms/cm$^3$ to about $1\times10^{17}$ atoms/cm$^3$. The impurity concentrations and the depths of the impurity regions 101 and 103 may not be limited to the above descriptions. That is, the impurity regions 101 and 103 may be designed to have other impurity concentrations and depths which are different from the above descriptions.

Figure 12:
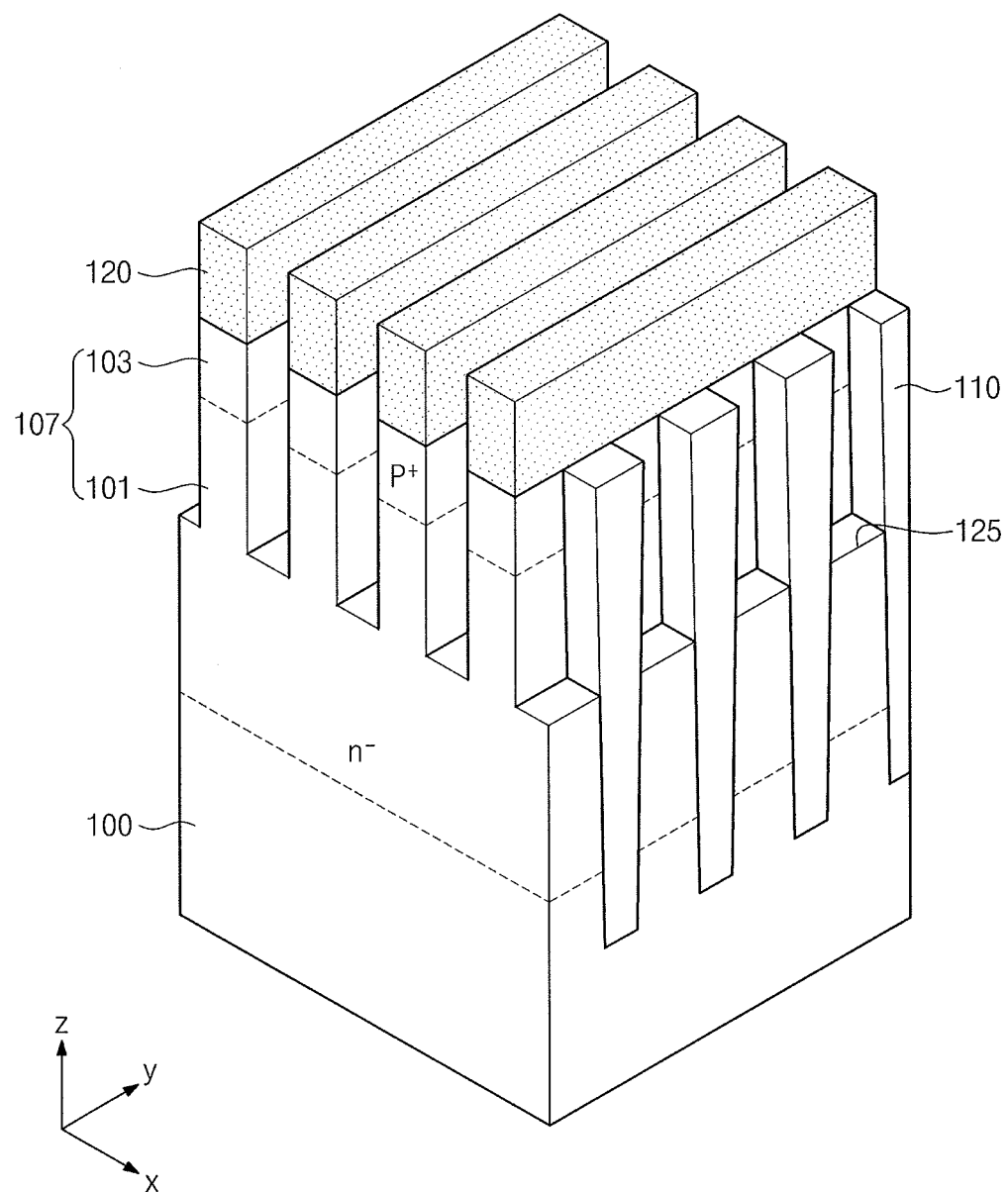

Referring to FIG. 12, the semiconductor substrate 100 having the line patterns 105 may be patterned to form openings 125. Specifically, mask patterns 120 crossing over the isolation layers 110 may be formed on the substrate having the line patterns 105. In an embodiment, a width (along a Y-axis direction) of the mask patterns 120 may be substantially equal to a width of the isolation layers 110.

The mask patterns 120 may be formed of silicon-based materials. For example, the mask patterns 120 may be formed of any one of a silicon oxynitride (SiON) layer, a silicon oxide (SiO$_2$) layer, a silicon nitride (Si$_3$N$_4$) layer, a silicon carbonitride (SiCN) layer and a polysilicon layer. Alternatively, the mask patterns 120 may be formed of a carbon-based spin on hard mask (SOH) layer, a silicon-based spin on hard mask (SOH) layer or an amorphous carbon layer.

Using the mask patterns 120 and the isolation layers 110 as etching masks, the semiconductor substrate 100 (e.g., the line patterns 105) may be anisotropically etched to form a plurality of openings 125 disposed between the adjacent isolation layers 110. A depth of the openings 125 may be less than a depth of the trenches (e.g., a vertical thickness of the isolation layers 110) described with reference to FIG. 11. That is, bottom surfaces of the openings 125 may be located at a higher level (along the z-axis direction) than bottom surfaces of the isolation layers 110. The openings 125 may expose portions of upper sidewalls of the isolation layers 110.

As a result of the openings 125, a plurality of protruding patterns 107 may be formed. The protruding patterns 107 may include first sidewalls contacting the isolation layers 110 and second sidewalls exposed by the openings 125. The protruding patterns 107 may be spatially separated from each other by the isolation layers 110 and the openings 125. Thus, the protruding patterns 107 may be two dimensionally arrayed in rows and columns. Each of the protruding patterns 107 may include the upper impurity region 103 and the lower impurity region 101. That is, PN diodes or PIN diodes may be provided in the protruding patterns 107, respectively.

Figure 13:
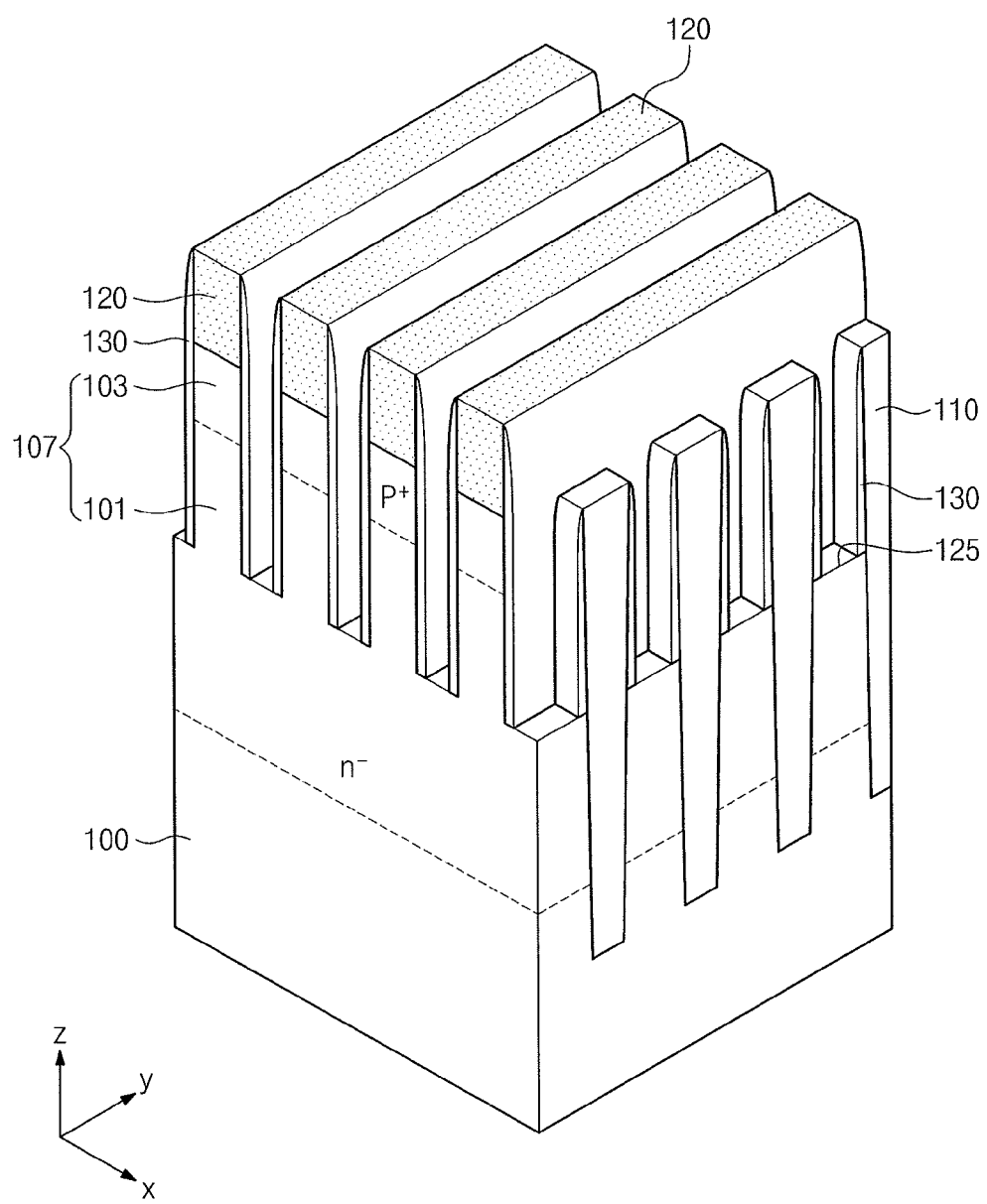

Referring to FIG. 13, sidewall spacers 130 may be formed on the second sidewalls of the protruding patterns 107, which are exposed by the openings 125. Specifically, forming the sidewall spacers 130 may include depositing a spacer layer on an entire surface of the substrate 100 having the openings 125 and anisotropically etching the spacer layer. Thus, the sidewall spacers 130 may cover the second sidewalls of the protruding patterns 107 and sidewalls of the isolation layers 110 exposed by the openings 125. That is, the sidewall spacers 130 may cover inner walls of the openings 125 and may protect the protruding patterns 107 including the lower and upper impurity regions 101 and 103. The spacer layer may include a silicon oxide material, a silicon nitride material and/or a silicon oxynitride material.

Figure 14:
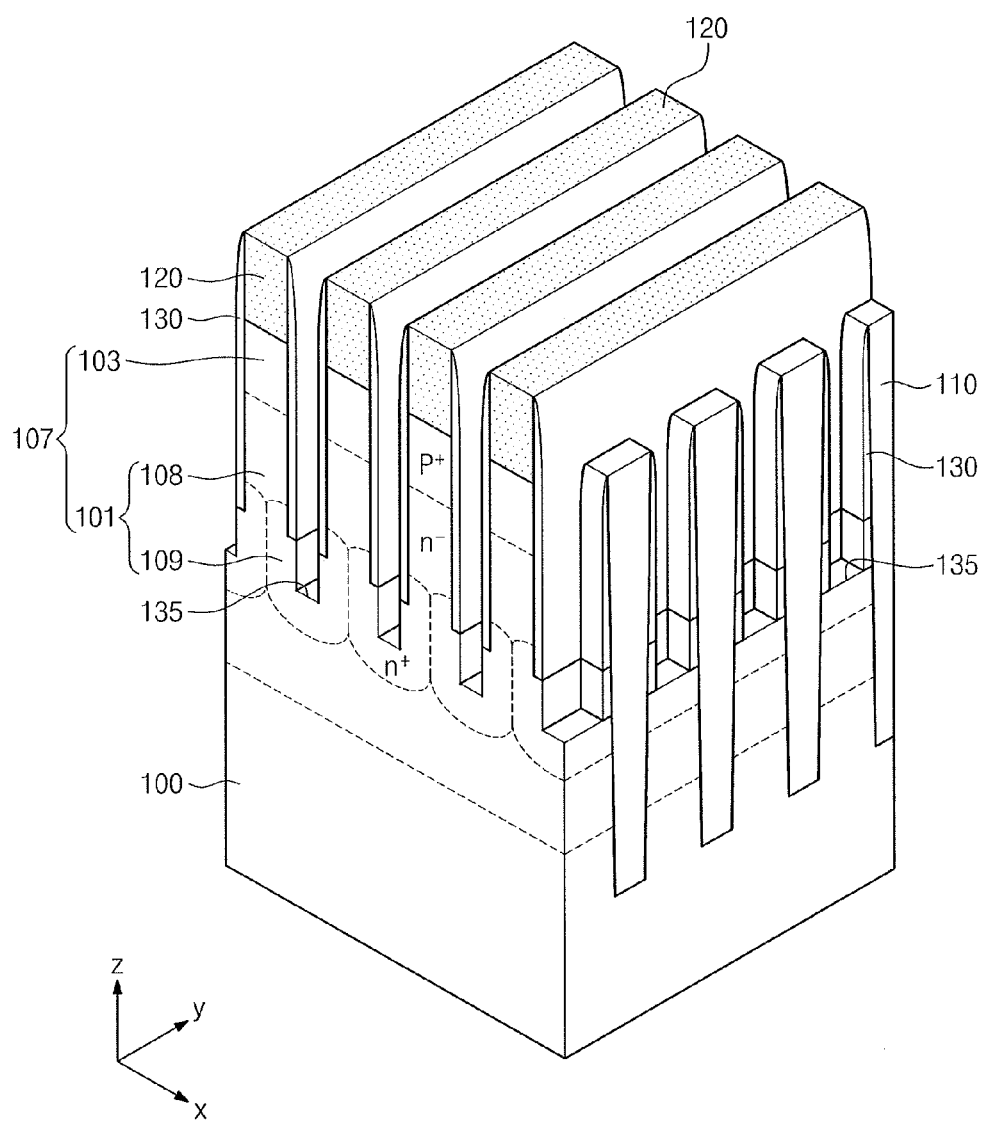

Referring to FIG. 14, lower heavily doped impurity regions 109 of a first conductivity type (e.g., an N-type) may be formed in the semiconductor substrate 100 under the protruding patterns 107.

Specifically, the lower heavily doped impurity regions 109 may be formed by injecting impurities of the first conductivity type into the semiconductor substrate 100 under the openings 125 with a relatively high dose and diffusing the impurities of the first conductivity type in the semiconductor substrate 100. For example, the lower heavily doped impurity regions 109 may be formed using a rapid vapor phase doping method, a plasma doping method or a low energy implantation method.

In an embodiment, the lower heavily doped impurity regions 109 may be formed in the semiconductor substrate 100 between the adjacent isolation layers 110 and in the semiconductor substrate 100 under protruding patterns 107. Further, the lower heavily doped impurity regions 109 may be formed across the semiconductor substrate 100 under the protruding patterns 107 by the diffusion of the first conductivity type impurities.

In more detail, forming the lower heavily doped impurity regions 109 may include forming recessed regions 135 under the openings 125 surrounded by the sidewall spacers 130 and doping the semiconductor substrate exposed by the recessed regions 135 with impurities of a first conductivity type using a plasma doping process. The recessed regions 135 may be formed by anisotropically etching the semiconductor substrate 100 using the sidewall spacers 130 as etching masks. According to the plasma doping process, the semiconductor substrate 100 exposed by the recessed regions 135 may be doped with impurity ions existing in plasma generated in a process chamber. Further, according to the plasma doping process, the impurity ions are injected into the semiconductor substrate 100 to a high dose with a ultra low energy of about 0.02 KeV to about 20 KeV. Moreover, a doping energy of the impurities accelerated toward the semiconductor substrate 100 may be increased by adjusting a bias applied to the semiconductor substrate 100 during the plasma doping process. Thus, in the event that the plasma doping process is used to form the lower heavily doped impurity regions 109, the lower heavily doped impurity regions 109 may be successfully formed under the protruding patterns 107 without any damage to the protruding patterns 107.

In an embodiment, the lower heavily doped impurity regions 109 may be formed using the plasma doping process employing PH$_3$, PF$_3$, AsH$_3$ or AsF$_5$ as an impurity source material. The lower heavily doped impurity regions 109 may have an N-type impurity concentration of about $1\times10^{17}$ atoms/cm$^3$ to about $1\times10^{21}$ atoms/cm$^3$.

After the plasma doping process, the substrate having the lower heavily doped impurity regions 109 may be annealed to activate the impurity ions in the lower heavily doped impurity regions 109. Therefore, since the impurity ions generated by the plasma doping process are supplied through the recessed regions 135, the lower heavily doped impurity regions 109 may be formed in the semiconductor substrate 100 beside and under the recessed regions 135. Thus, the lower heavily doped impurity regions 109 may be formed to cross regions under the protruding patterns 107 and to extend in the first direction. After formation of the lower heavily doped impurity regions 109, lower lightly doped impurity regions 108 may be defined between the upper impurity regions 103 and the lower heavily doped impurity regions 109. Each of the lower impurity regions 101 may include the lower heavily doped impurity region 109 and the lower lightly doped impurity region 108 which are sequentially stacked.

Figure 15:
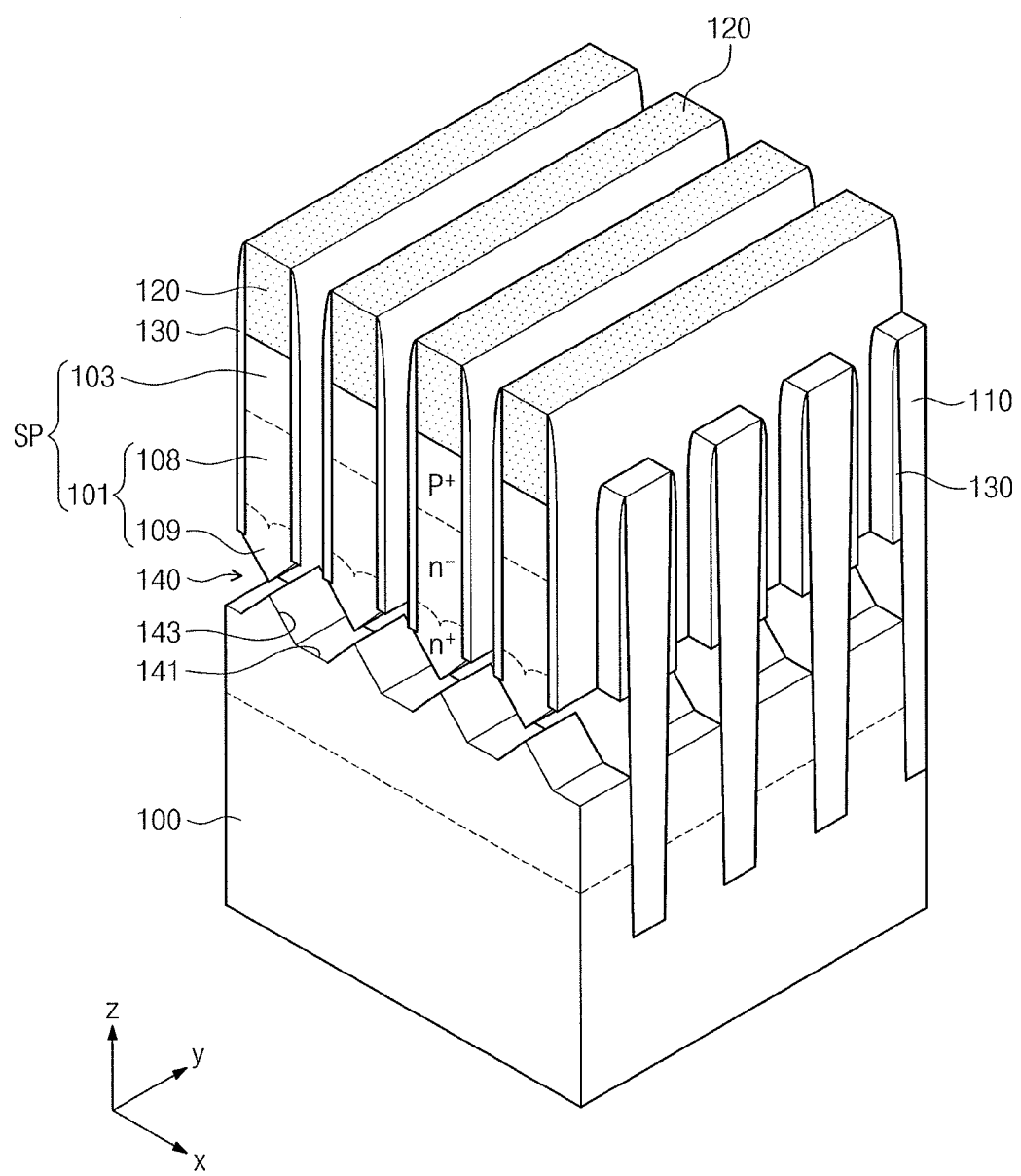

Referring to FIG. 15, undercut regions 140 may be formed under the protruding patterns 107. The undercut regions 140 are formed to vertically separate the protruding patterns 107 from the semiconductor substrate 100.

The undercut regions 140 may be formed by vertically and laterally etching the semiconductor substrate 100 exposed by the recessed regions 135 between the protruding patterns 107. In an embodiment, the undercut regions 140 may be formed to pass through the regions under the protruding patterns 107 which are arrayed in the first direction. The undercut regions 140 may be formed by etching the lower heavily doped impurity regions 109 corresponding to the semiconductor substrate 100 located under the protruding patterns 107.

In more detail, the undercut regions 140 may be formed by isotropically and/or anisotropically etching the semiconductor substrate 100 using the isolation layers 110, the mask patterns 120 and the sidewall spacers 130 as etching masks. Thus, the undercut regions 140 may laterally extend from the recessed regions 135 between the protruding patterns 107 toward regions under the protruding patterns 107. The undercut regions 140 may expose the lower heavily doped impurity regions 109 of the protruding patterns 107. That is, the undercut regions 140 may be defined by a top surface of the etched semiconductor substrate 100 separated from the protruding patterns 107 and bottom surfaces of the separated protruding patterns. The separated protruding patterns may correspond to semiconductor pillars SP. Thus, each of the semiconductor pillars SP may include the lower heavily doped impurity region 109, the lower lightly doped impurity region 108 and the upper impurity region 103 which are sequentially stacked. The undercut regions 140 may be substantially parallel with the isolation layers 110 and may partially expose the sidewalls of the isolation layers 110 adjacent thereto.

As a result of formation of the undercut regions 140, the semiconductor pillars SP may be vertically spaced apart from the semiconductor substrate 100. In other words, the semiconductor pillars SP may be vertically separated from the semiconductor substrate 100 and may be stably floated on the undercut regions 140. This is because the semiconductor pillars SP can be supported by the isolation layers 110. Since the semiconductor pillars SP are disposed between the isolation layers 110 and are in direct contact with the sidewalls of the isolation layers 110, the isolation layers 110 may prevent the semiconductor pillars SP from tumbling down. The semiconductor diodes formed in the semiconductor pillars SP may exhibit excellent electrical characteristics since the semiconductor pillars SP are spaced apart from the semiconductor substrate 100.

In an embodiment, the semiconductor substrate 100 may include a silicon substrate having a top surface of a (100) plane. In this case, the undercut regions 140 may be formed by anisotropically wet-etching the semiconductor substrate 100. The anisotropic wet etching process may correspond to a crystallographic etching process. In the crystallographic etching process, an etch rate of the semiconductor substrate may be varied according to a lattice plane and a lattice orientation of a surface exposed to the etch chemistry.

This crystallographic etching process may be performed using a hydroxide-based etchant or an ethylene diamine pyrocatechol (EDP) type etchant. In detail, the crystallographic etching process to a silicon substrate may be performed using an etchant including a potassium hydroxide (KOH) solution, a sodium hydroxide (NaOH) solution, an ammonium hydroxide ($NH_4OH$) solution, or a tetra-methyl-ammonia hydroxide (TMAH) solution. For example, when the ammonium hydroxide ($NH_4OH$) solution is used to etch the silicon substrate having a top surface of a (100) plane, the crystallographic etching process may exhibit an etching property that an etch rate to an (111) plane is slowest and an etch rate to a (100) plane is fastest. Thus, in the event that the etching process is performed using the ammonium hydroxide ($NH_4OH$) solution, surfaces exposed by the undercut regions 140 may have a plane orientation of (111).

The undercut regions 140 formed using the anisotropic wet etching process described above may be defined by top surfaces of the etched semiconductor substrate 100 separated from the protruding patterns (107 of FIG. 14) and sloped bottom surfaces of the semiconductor pillars SP. The top surfaces of the etched semiconductor substrate 100 may include flat floor surfaces 141 and sloped surfaces 143 obliquely extended from edges of the floor surfaces 141. In this case, an angle between the flat floor surfaces 141 and the sloped surfaces 143 may be less than 180 degrees. In more detail, when the semiconductor substrate 100 has a top surface of a (100) plane, the floor surfaces 141 of the etched semiconductor substrate 100 may have a plane orientation of (100) and the sloped surfaces 143 of the etched semiconductor substrate 100 may have a plane orientation of (111), (211), or (311). Further, the sloped bottom surfaces of the semiconductor pillars SP may have a plane orientation of (100), (111), (211), or (311). The bottom surface of each semiconductor pillar SP may include a flat surface parallel with the floor surfaces 141 according to a distance between the semiconductor pillars SP.

The top surfaces of the etched semiconductor substrate 100 exposed by the undercut regions 140 may have different plane orientations according to a depth of the recessed regions 135. In addition, the deeper the recessed regions 135 are, the sharper the top surfaces of the etched semiconductor substrate 100 are. That is, the top surfaces of the etched semiconductor substrate 100 may be formed to have only sloped surfaces without the floor surfaces (141 of FIG. 15). For example, the top surfaces of the etched semiconductor substrate 100 exposed by the undercut regions 140 may be formed to have only the sloped surfaces of (111) planes, as illustrated in FIG. 7.

In another embodiment, the semiconductor substrate 100 may correspond to a silicon substrate having a top surface of a (110) plane. In this case, the undercut regions 140 may be formed by isotropically wet-etching the semiconductor substrate 100 exposed by the recessed regions 135 using the isolation layers 110, the mask patterns 120 and the sidewall spacers 130 as etching masks. If the isotropic wet-etching process is applied to the semiconductor substrate 100 exposed by the recessed regions 135, the semiconductor substrate 100 may be isotropically etched regardless of the plane orientation of the exposed surfaces of the semiconductor substrate 100. Further, the isotropic wet-etching process may be performed using a chemical solution including at least one of a hydrofluoric (HF) acid solution, a nitric acid ($HNO_3$) solution and an acetic acid ($CH_3COOH$) solution as an etchant.

In the event that the undercut regions 140 are formed using the isotropic wet-etching process, the top surfaces of the etched semiconductor substrate 100 may have rounded shapes, as illustrated in FIG. 8. Alternatively, if a distance between the semiconductor pillars SP decreases, the top surfaces of the etched semiconductor substrate 100 may have a flat shape.

During formation of the undercut regions 140, the surfaces of the etched semiconductor substrate 100 and the bottom surfaces of the semiconductor pillars SP may be damaged, e.g., may have defects. Thus, a cleaning process may be applied to the substrate including the undercut regions 140 using ozone ($O_3$) and hydrofluoric (HF) acid, after formation of the undercut regions 140.

Figure 16:
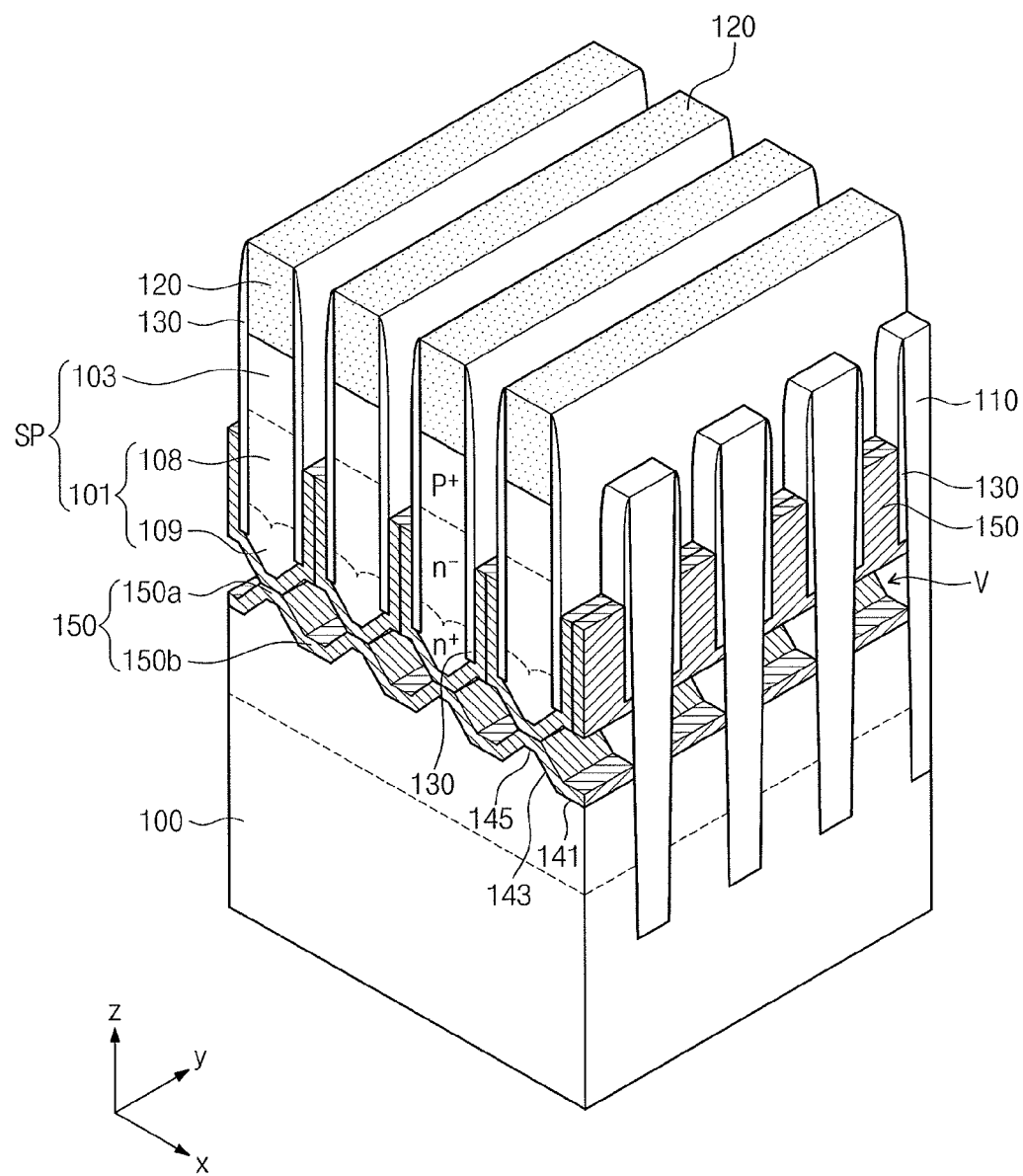

Referring to FIG. 16, lower interconnections 150 may be formed in the undercut regions 140. The lower interconnections 150 may be formed of a metallic material. The lower interconnections 150 may include portions 150a under the semiconductor pillars SP and portions 150b between the semiconductor pillars SP.

Specifically, forming the lower interconnections 150 may include depositing a metallic layer in the openings 125 and the undercut regions 140, and removing the metallic layer on the isolation layers 110 to form the lower interconnections 150 separated from each other in a second direction (e.g., a Y-axis direction) crossing the first direction. The lower interconnections 150 formed using the aforementioned method may directly contact the bottom surfaces of the semiconductor pillars SP. The lower interconnections 150 may be electrically insulated from each other by the isolation layers 110.

In an embodiment, the metallic layer may be deposited using a physical vapor deposition (PVD) process, a chemical vapor deposition (CVD) process, a low pressure chemical vapor deposition (LPCVD) process, a plasma enhanced chemical vapor deposition (PECVD) process, an atomic layer deposition (ALD) process, an electron beam evaporation process or a pulse laser deposition process.

When the lower interconnections 150 are formed using the deposition process, process gases may be supplied into the openings 125 and the undercut regions 140. Thus, the metallic layer may be formed to a uniform thickness on the inner walls of the undercut regions 140 and the openings 125. Furthermore, a thickness of the metallic layer may be equal to or greater than a half of a width of the openings 125.

In an embodiment, in the event that a vertical thickness (e.g., a distance in a Z-direction) of the undercut regions 140 is different according to a location, each of the lower interconnections 150 may have empty voids (V) therein. That is, the vertical thickness of the undercut regions 140 under central regions of the bottom surfaces of the semiconductor pillars SP may be less than the vertical thickness of the undercut regions 140 adjacent to the openings 125 between the semiconductor pillars SP. Thus, the voids V may be locally formed under the openings 125 and under edges of the semiconductor pillars SP. Alternatively, the undercut regions 140 may be completely filled with the metallic layer, as illustrated in FIGS. 6 to 9.

In an embodiment, the metallic layer may include at least one of a conductive metal nitride material, a conductive metal oxynitride material, a metallic material, and a conductive carbon-based compound material. For example, each of the lower interconnections 150 may include at least one of a titanium nitride (TiN) layer, a tantalum nitride (TaN) layer, a tungsten nitride (WN) layer, a molybdenum nitride (MoN) layer, a niobium nitride (NbN) layer, a TiSiN layer, a TiAlN layer, a TiBN layer, a ZrSiN layer, a WSiN layer, a WBN layer, a ZrAlN layer, a MoSiN layer, a MoAlN layer, a TaSiN layer, a TaAlN layer, a titanium (Ti) layer, a tungsten (W) layer, a molybdenum (Mo) layer, a tantalum (Ta) layer, a titanium silicide (TiSi) layer, a tantalum silicide (TaSi) layer, a titanium oxynitride (TiON) layer, a TiAlON layer, a tungsten oxynitride (WON) layer, a tantalum oxynitride (TaON) layer, and a group of conductive carbon-based compound layers. As such, since the lower interconnections 150 may be formed of a metallic material, an increase of electrical resistance of the lower interconnections 150 may be suppressed even though the semiconductor device including the lower interconnections 150 is scaled down.

During formation of the lower interconnections 150, if the width of the openings 125 becomes reduced, the metallic material may stuff the openings 125 before the metallic material is deposited on the bottom surfaces of the semiconductor pillars SP. That is, before the metal layer electrically connecting the semiconductor pillars SP located on each undercut region 140 is successfully formed, the openings 125 may be stuffed with the metal layer. In this case, the process gases for forming the metal layer cannot be introduced into the undercut regions 140 through the openings 125. Thus, the process for forming the metal layer may include a deposition process and an anisotropic etching process which are alternately and repeatedly performed. In other words, the process for forming the metal layer may include a deposition process for forming a metal layer in the undercut regions 140 and the openings 125, and an anisotropic etching process for etching the metal layer in the openings 125.

In an embodiment, forming the lower interconnections 150 separated from each other in the second direction may include removing the metal layer deposited on the isolation layers 110 using a blanket anisotropic etch process such as an etch back process. When the lower interconnections 150 are formed using the anisotropic etch process, a portion of the metal layer filling each opening 125 may be removed. That is, the metal layer is recessed so that topmost surfaces of the lower interconnections 150 are located at a lower level than top surfaces of the semiconductor pillars SP.

Each of the lower interconnections 150 in the undercut regions 140 may be formed to have a different thickness according to a position thereof, as illustrate in FIG. 16. That is, each of the lower interconnections 150 may include first portions 150a under the semiconductor pillars SP and second portions 150b between the first portions 150a. A thickness of the first portions 150a may be different from that of the second portions 150b.

Figure 17:
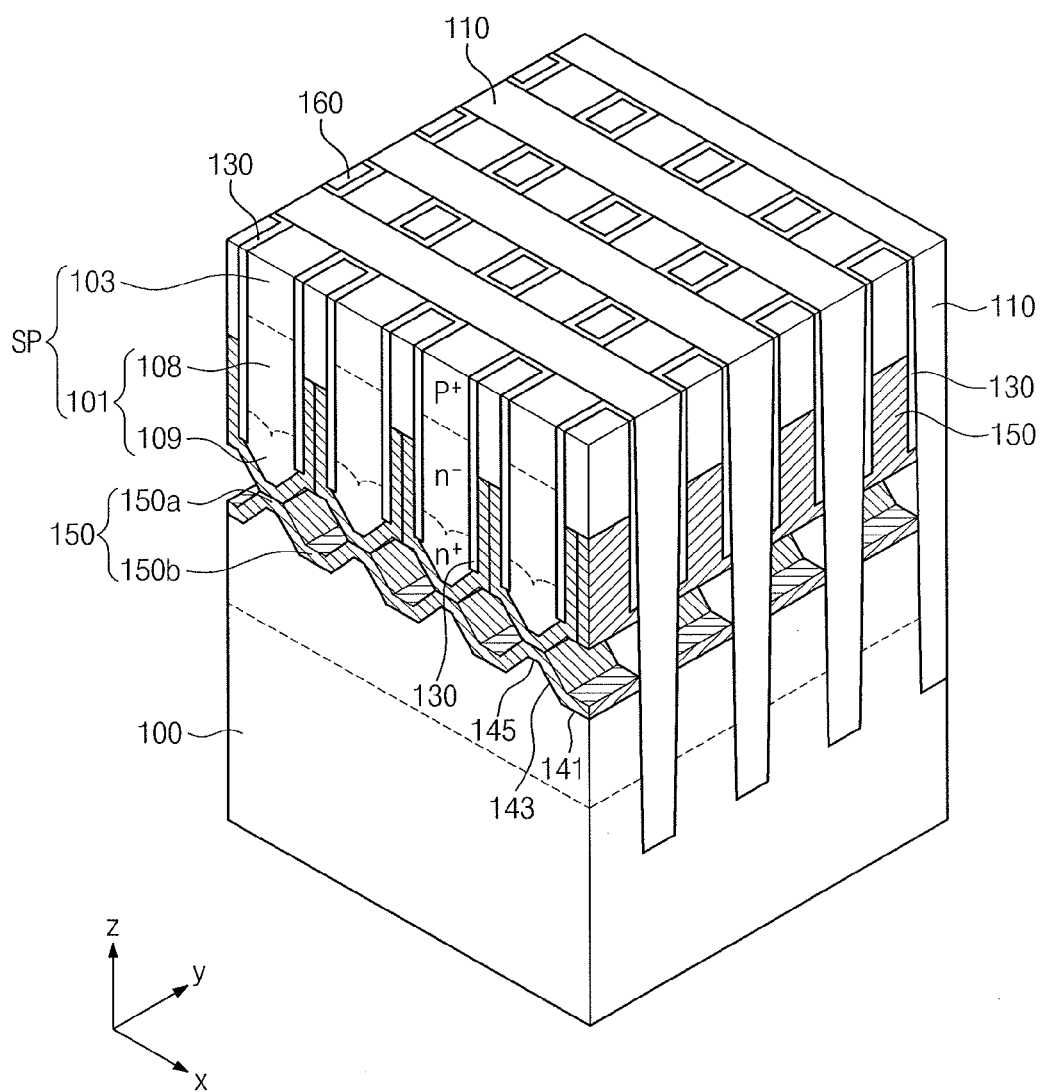

Referring to FIG. 17, the mask patterns 120 may be removed, and buried patterns 160 may be formed to fill the openings 125 on the lower interconnections 150.

The buried patterns 160 may be formed on the lower interconnections 150 exposed by the openings 125. The buried patterns 160 may be respectively formed in the openings 125 by depositing a filling insulation layer filling the openings 125 on the substrate including lower interconnections 150 and planarizing the filling insulation layer and the mask patterns 120 until the top surfaces of the semiconductor pillars SP are exposed. The filling insulation layer may include a high density plasma (HDP) oxide layer and/or a spin on glass (SOG) layer.

Figure 18:
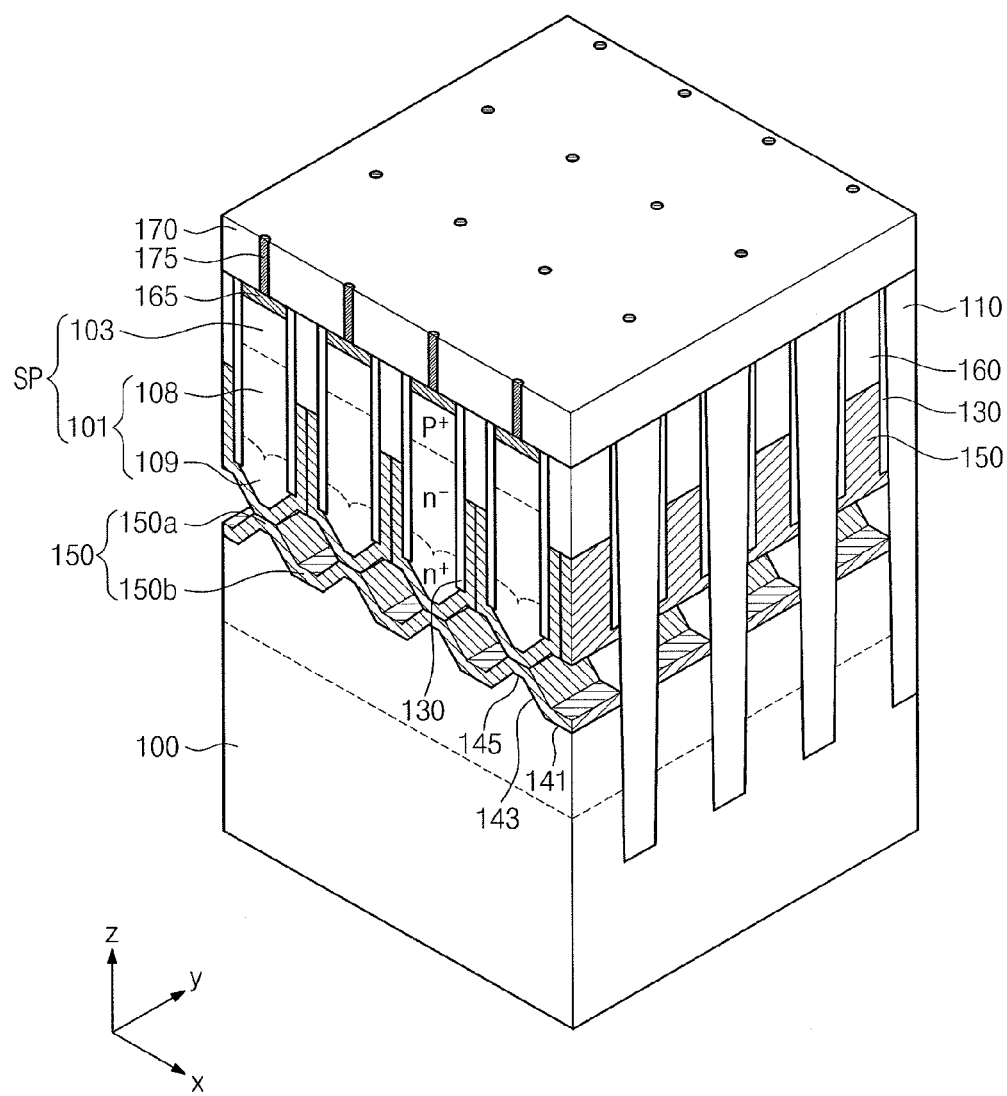

Referring to FIG. 18, an interlayer dielectric layer 170 and lower electrodes 175 penetrating the interlayer dielectric layer 170 to contact the semiconductor pillars SP may be formed on the substrate including the buried patterns 160 and the semiconductor pillars SP.

In an embodiment, forming the lower electrodes 175 may include forming contact holes penetrating the interlayer dielectric layer 170 to expose the semiconductor pillars SP and burying a conductive material in the contact holes. In an embodiment, insulation spacers (not shown) may be formed on inner walls of the contact holes before the conductive material is formed in the contact holes. In the event that the insulation spacers are formed on the inner walls of the contact holes, the lower electrodes 175 may be formed to have a width which is less than a resolution limit of a photolithography technique. The lower electrodes 175 buried in the contact holes may have a pillar shape. In another embodiment, the lower electrodes 175 may be embodied in various forms which are capable of reducing an area of a horizontal section thereof. For example, each of the lower electrodes 175 may have a three dimensional structure such as a U-shaped structure, an L-shaped structure, a hollow cylinder-shaped structure, a ring-shaped structure, or a cup-shaped structure.

Prior to formation of the interlayer dielectric layer 170, ohmic patterns 165 may be formed on top surfaces of the semiconductor pillars SP, respectively. Specifically, each of the ohmic patterns 165 may include a metal silicide material such as a titanium silicide layer, a cobalt silicide layer, a tantalum silicide layer, or a tungsten silicide layer. In more detail, the ohmic patterns 165 may be formed by depositing a metal layer covering the top surfaces of the semiconductor pillars SP, applying a silicidation process to the substrate having the metal layer and removing an unreacted metal.

Subsequently, referring to FIG. 3, memory elements 180 and upper interconnections 190 may be formed on the lower electrodes 175.

In an embodiment, the memory elements 180 may be formed to be electrically connected to the lower electrodes 175, respectively. That is, the memory elements 180 may be two dimensionally arrayed, and each of the upper interconnections 190 may be electrically connected to the memory elements 180 which are arrayed in a direction crossing the lower interconnections 150. In anther embodiment, the memory elements 180 may extend to be parallel with the upper interconnections 190. That is, the memory elements 180 and the upper interconnections 190 may be formed to cross over the lower interconnections 150.

In an embodiment, each of the memory elements 180 may include at least one of materials having a variable resistive property. The electrical resistance of variable resistive materials may be changed according to a current passing through the variable resistive materials. For example, each of the memory elements 180 may include a phase changeable material pattern such as a chalcogenide material. The phase changeable material patterns may be formed by depositing a phase changeable material layer on the substrate having the lower electrodes 175 and patterning the phase changeable material layer. The phase changeable material patterns may be formed to be connected to the lower electrodes 175, respectively. The phase changeable material layer may be formed of a Ge—Sb—Te layer, a As—Sb—Te layer, a As—Ge—Sb—Te layer, a Sn—Sb—Te layer, a Ag—In—Sb—Te layer, a In—Sb—Te layer, a 5A group element-Sb—Te layer, a 6A group element-Sb—Te layer, 5A group element-Sb—Se layer, a 6A group element-Sb—Se layer, a Ge—Sb layer, a In—Sb layer, a Ga—Sb layer, or a doped Ge—Sb—Te layer. The doped Ge—Sb—Te layer may be doped with carbon (C), nitrogen (N), boron (B), bismuth (Bi), silicon (Si), phosphorus (P), aluminum (Al), dysprosium (Dy) or titanium (Ti). The phase changeable material layer may be formed using a physical vapor deposition (PVD) process or a chemical vapor deposition (CVD) process.

Alternatively, each of the memory elements 180 may include a perovskite compound material, a transition metal oxide material, a magnetic material, a ferromagnetic material or an anti-ferromagnetic material, instead of the phase changeable material.

Each of the upper interconnections 190 may be formed of at least one of a nitride material containing a metal element, an oxynitride material containing a metal element, a carbon (C) material, a titanium (Ti) material, a tantalum (Ta) material, a TiAl material, a zirconium (Zr) material, a hafnium (Hf) material, a molybdenum (Mo) material, an aluminum (Al) material, an Al—Cu layer, an Al—Cu—Si material, a copper (Cu) material, a tungsten (W) material, a TiW material and a tungsten silicide (WSix) material. The nitride material containing a metal element may include at least one of a titanium nitride (TiN) layer, a tantalum nitride (TaN) layer, a tungsten nitride (WN) layer, a molybdenum nitride (MoN) layer, a niobium nitride (NbN) layer, a TiSiN layer, a TiAlN layer, a TiBN layer, a ZrSiN layer, a WSiN layer, a WBN layer, a ZrAlN layer, a MoSiN layer, a MoAlN layer, a TaSiN layer and a TaAlN layer. The oxynitride material containing a metal element may include at least one of a titanium oxynitride (TiON) layer, a TiAlON layer, a tungsten oxynitride (WON) layer and a tantalum oxynitride (TaON) layer. A barrier metal layer may be formed between the upper interconnections 190 and the phase changeable material patterns.

Hereinafter, a method of manufacturing a semiconductor device according to another embodiment of the inventive concept will be described with reference to FIGS. 19 to 23. FIGS. 19 to 23 illustrate cross sectional views of stages in a method of manufacturing a semiconductor device according to another embodiment of the inventive concept, and each of FIGS. 19 to 23 includes cross sectional views taken along lines I-I' and II-II' of FIG. 3. The present embodiment is different from the previous embodiment in terms of a formation method of semiconductor pillars. That is, the semiconductor pillars of the semiconductor device according to the present embodiment may be formed using a selective epitaxial growth (SEG) process.

Figure 19:
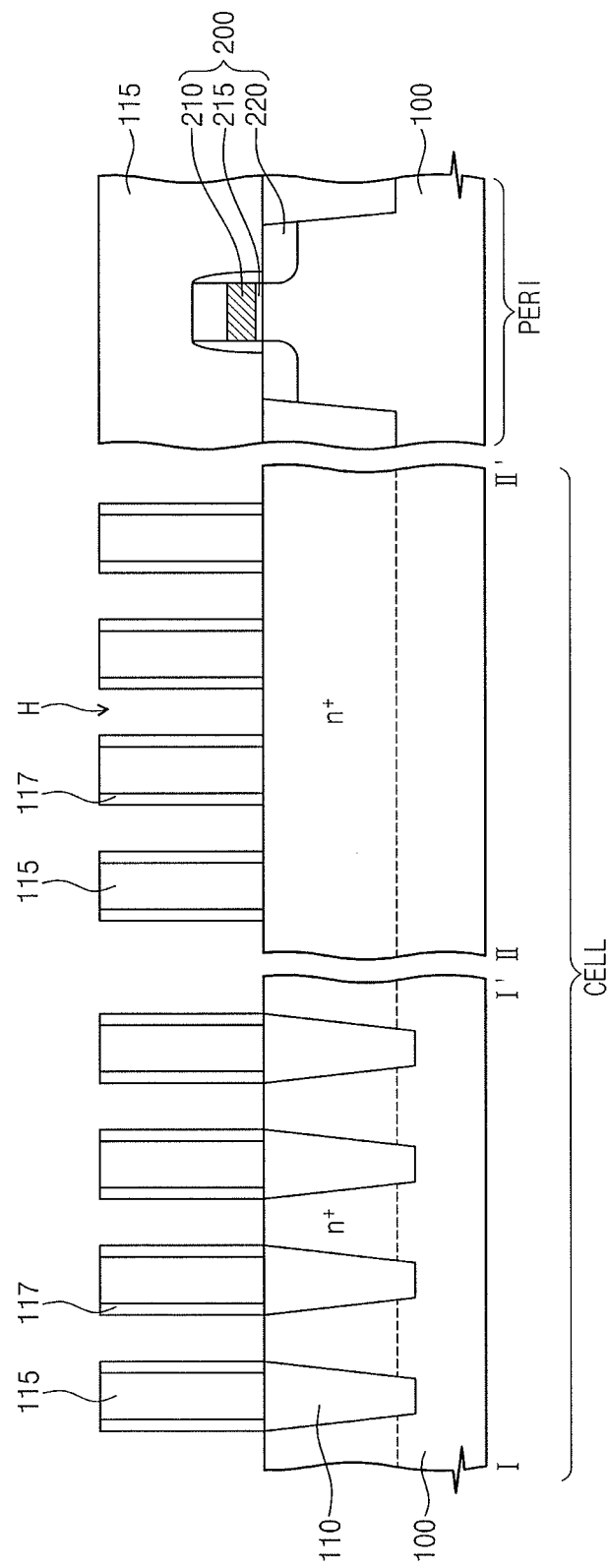
FIGS. 19 to 23 illustrates cross sectional views of stages in a method of manufacturing a semiconductor device according to another embodiment of the inventive concept, and each of FIGS. 19 to 23 includes cross sectional views taken along lines I-I' and II-II' of FIG. 3.

Referring to FIG. 19, an interlayer dielectric layer 115 may be formed on a semiconductor substrate 100 having a cell array region CELL and a peripheral circuit region PERI. The interlayer dielectric layer 115 in the cell array region CELL may be patterned to form holes H penetrating the interlayer dielectric layer 115. The holes H may be arrayed in a matrix form. In an embodiment, sidewall spacers 117 may be formed on sidewalls of the holes H. The sidewall spacers 117 may be formed of a material having an etch selectivity with respect to the interlayer dielectric layer 115.

Prior to formation of the interlayer dielectric layer 115, isolation layers 110 and MOS transistors 200 may be formed in the semiconductor substrate 100 of the cell array region CELL and on the semiconductor substrate 100 of the peripheral circuit region PERI, respectively. Each of the MOS transistors 200 may include a gate electrode 210 on the semiconductor substrate 100, a gate insulation layer 215 between the gate electrode 210 and the semiconductor substrate 100, and source/drain regions 220 located at both sides of the gate electrode 210. Thus, the interlayer dielectric layer 115 may be formed to cover peripheral circuit including the MOS transistors 200 in the peripheral circuit regions PERI.

Figure 20:
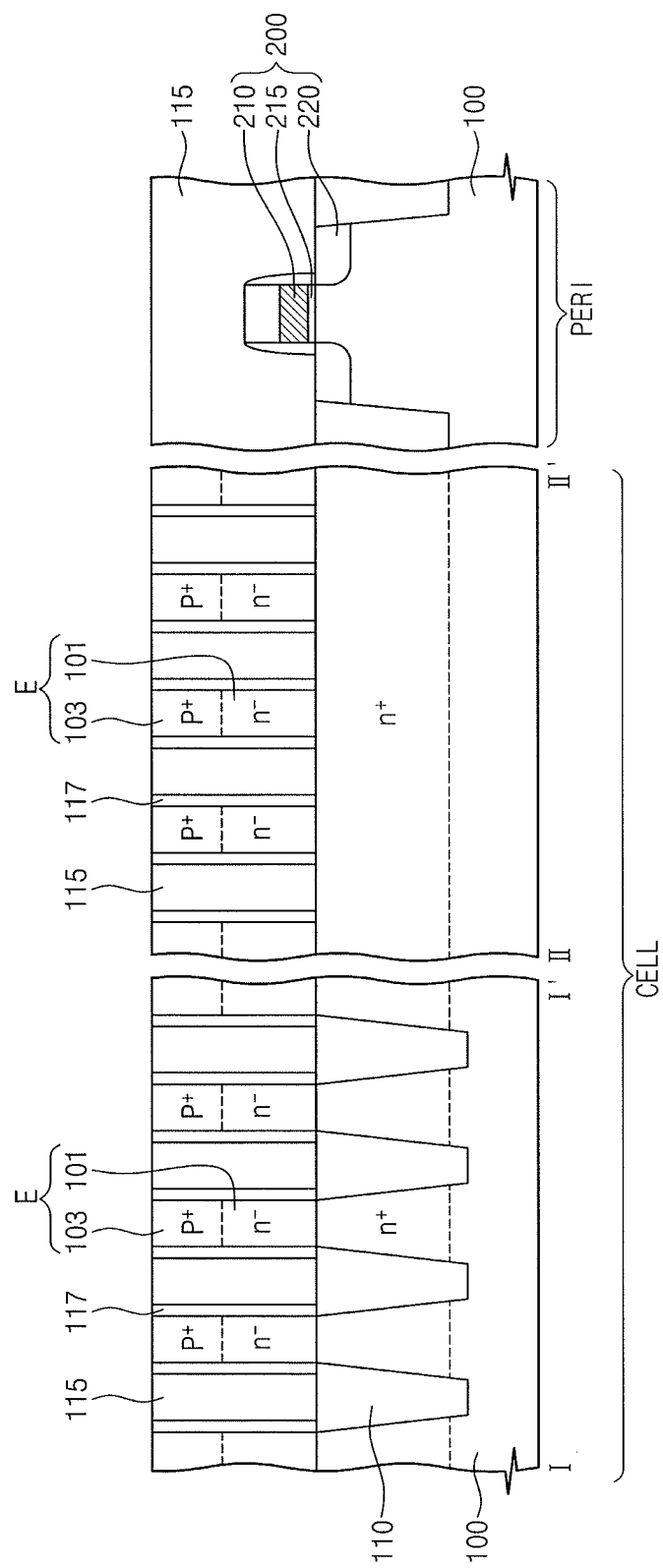

Referring to FIG. 20, epitaxial layers E may be formed in the holes H, respectively. The epitaxial layers E may be formed using a selective epitaxial growth (SEG) process that employs the semiconductor substrate 100 exposed by the holes H as seed layers.

Subsequently, N-type impurities are introduced into lower portions of the epitaxial layers E in the holes, thereby forming lower impurity regions 101. P-type impurities are introduced into upper portions of the epitaxial layers E in the holes E, thereby forming upper impurity regions 103. Alternatively, N-type impurities and P-type impurities may be sequentially introduced during the selective epitaxial growth (SEG) process, thereby simultaneously forming the impurity regions 101 and 103 and the epitaxial layers E. That is, the epitaxial layers E including the lower and upper impurity regions 101 and 103 may be formed using an in-situ doping process. The lower and upper impurity regions 101 and 103 in each epitaxial layer E may constitute a semiconductor diode.

Figure 21:
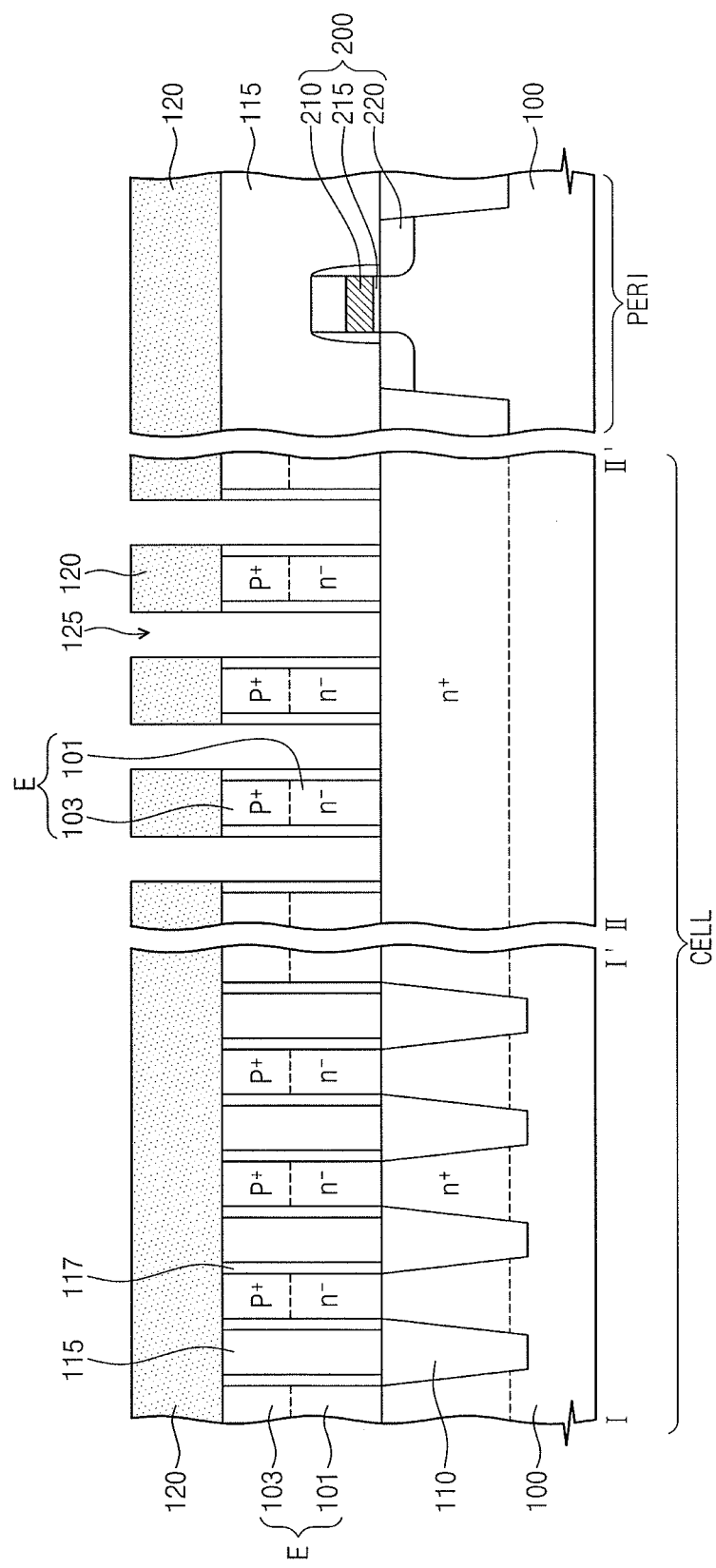

Referring to FIG. 21, a mask pattern 120 may be formed on the epitaxial layers E and the interlayer dielectric layer 115. The epitaxial layer E may be covered with the mask pattern 120, and the mask pattern 120 may be formed to have openings which are two dimensionally arrayed. The openings in the mask pattern 120 may expose the interlayer dielectric layer 115 between the epitaxial layers E arrayed in each row which is parallel with the first direction. That is, the mask pattern 120 may be formed to have a mesh shape. Alternatively, the openings in the mask pattern 120 may laterally extend in a second direction crossing the first direction. That is, the openings may be formed to have a line shape.

The interlayer dielectric layer 115 may be etched using the mask pattern 120 as an etch mask, thereby forming openings 125 that downwardly extend from the openings in the mask pattern 120 to expose portions of a top surface of the semiconductor substrate 100.

Subsequently, lower heavily doped impurity regions 109 may be formed under the epitaxial layers E using the same manners as described with reference to FIG. 14. The lower heavily doped impurity regions 109 may be formed by injecting first conductivity type impurities into the semiconductor substrate 100 exposed by the openings 125 and/or the sidewall spacers 117 with a high dose and diffusing the first conductivity type impurities in the semiconductor substrate 100. In more detail, forming the lower heavily doped impurity regions 109 may include forming recessed regions under the openings 125 surrounded by the sidewall spacers 117 and doping the semiconductor substrate 100 exposed by the recessed regions with first conductivity type impurities using a plasma doping process, as described with reference to FIG. 14.

Figure 22:
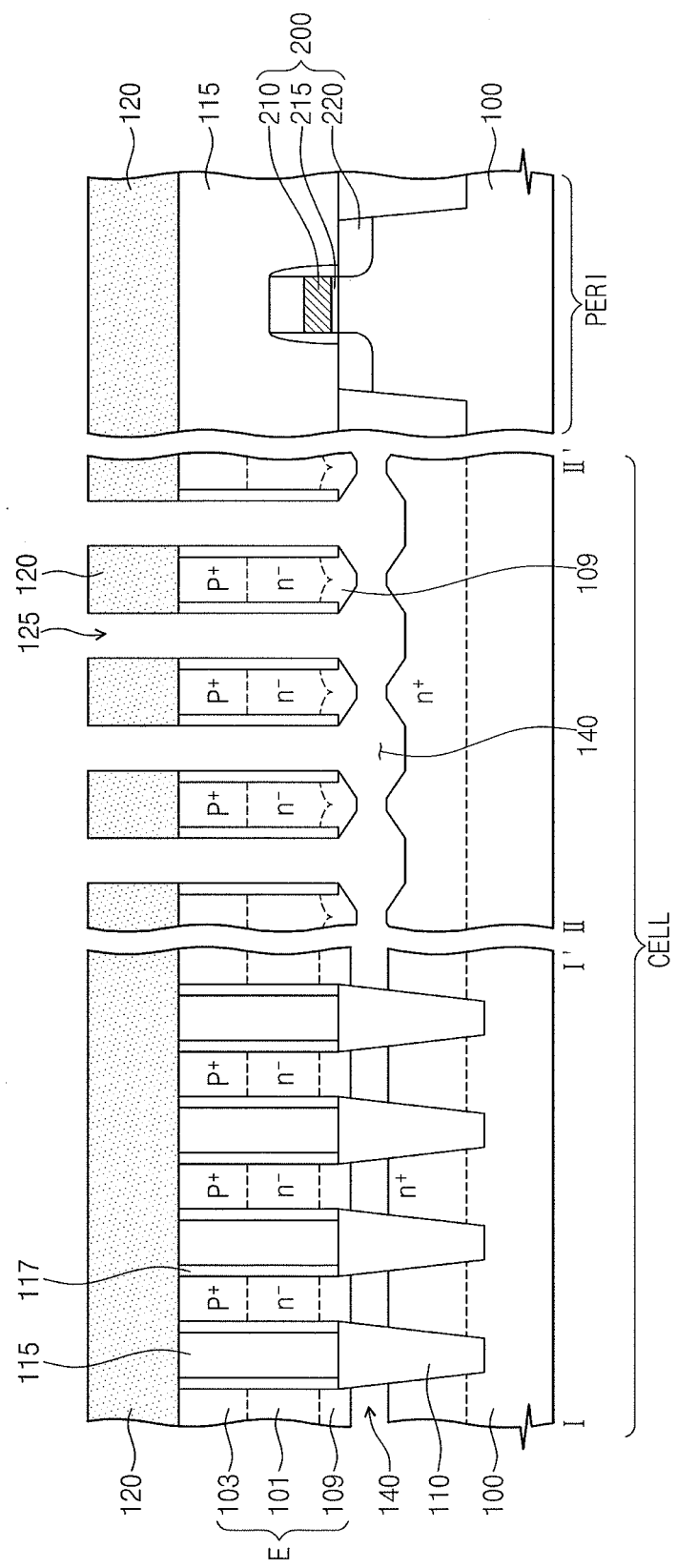

Referring to FIG. 22, undercut regions 140 crossing regions located under the epitaxial layers E may be formed using the same manners as described with reference to FIG. 15. That is, the undercut regions 140 may be formed by anisotropically and/or isotropically etching the semiconductor substrate 100 exposed by the recessed regions.

The undercut regions 140 may be defined by a top surface of the etched semiconductor substrate 100 vertically separated from the epitaxial layers E and bottom surfaces of the epitaxial layers E. The undercut regions 140 may expose the lower heavily doped impurity regions 109 formed in the lower portions of the epitaxial layers E. Further, the undercut regions 140 may be substantially parallel with the isolation layers 110. The undercut regions 140 may expose portions of sidewalls of the isolation layers 110.

Figure 23:
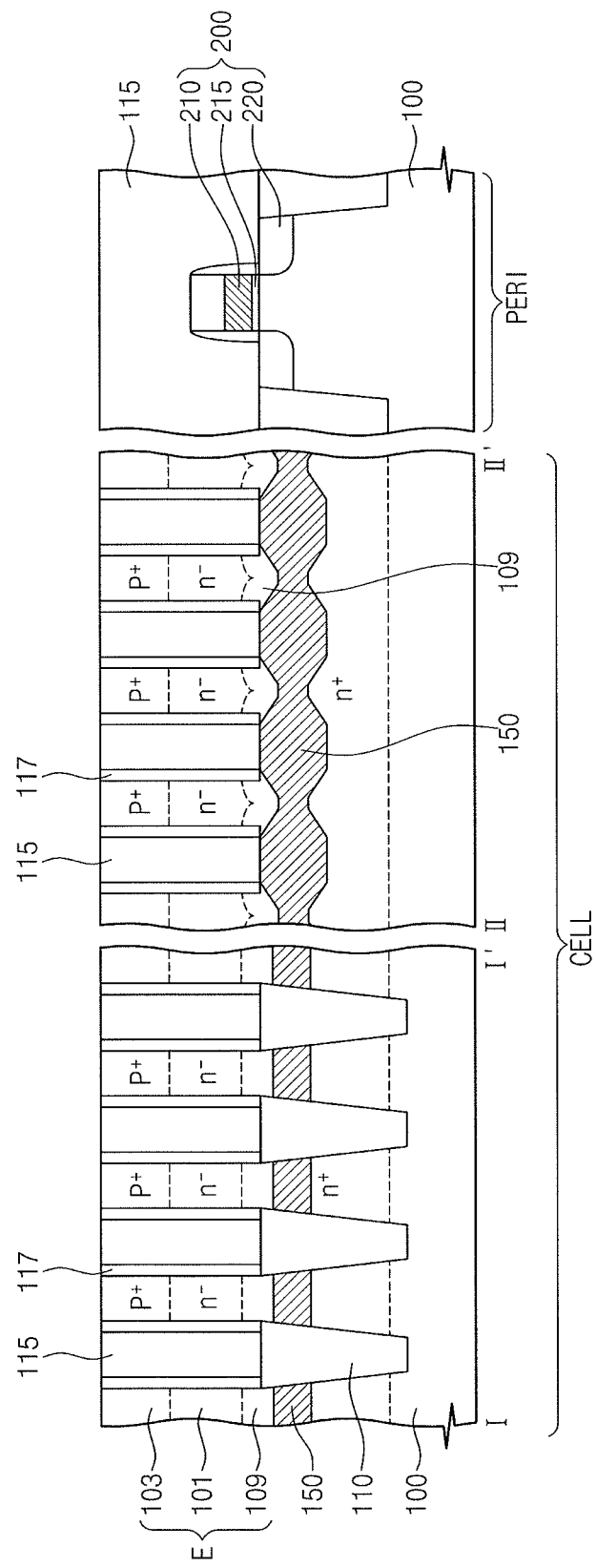

Referring to FIG. 23, a metallic material may be introduced into the undercut regions 140 to form lower interconnections 150 in the undercut regions 140, as described with reference to FIG. 16. The lower interconnections 150 in the undercut regions 140 may be formed to have a different thickness according a position of the respective portions thereof. This is due to a shape of the undercut regions 140. In addition, the lower interconnections 150 may be separated from each other by the isolation layers 110. Subsequently, the lower electrodes 175, the memory elements 180 and the upper interconnections 190 illustrated in FIG. 9 may be formed on the interlayer dielectric layer 115 and the epitaxial layers E.

Figure 24:
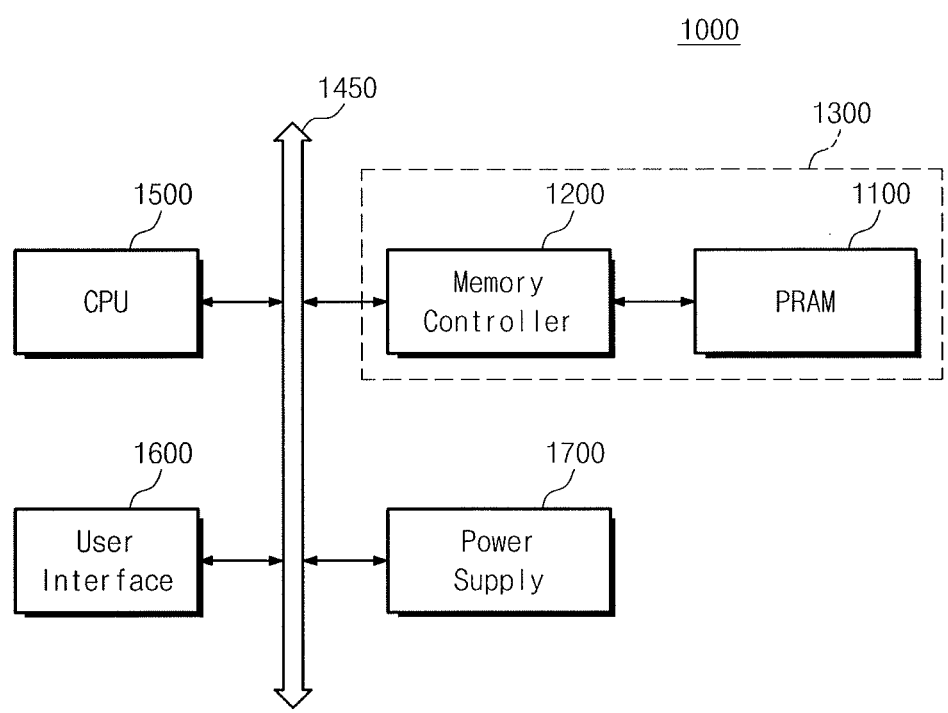
FIG. 24 illustrates a block diagram of an electronic system including one of the semiconductor devices according to embodiments.

FIG. 24 illustrates a block diagram of an electronic system including one of semiconductor devices according to embodiments of the inventive concept.

The electronic system 1000 including one of semiconductor devices according to embodiments of the inventive concept may correspond to one of an application chipset, a camera image processor, a personal digital assistant (PDA), a laptop computer, a portable computer, a web tablet, a wireless phone, a mobile phone, a digital music player, an electronic product for wireless or cable communication, or a combined electronic product including at least two thereof.

Referring to FIG. 24, the electronic system 1000 may include a semiconductor memory unit 1300, a central processing unit (CPU) 1500, a user interface 1600, a power supply unit 1700 and a system bus 1450. At least two of the semiconductor memory unit 1300, the central processing unit (CPU) 1500, the user interface 1600, and the power supply unit 1700 may communicate with each other through the system bus 1450. The semiconductor memory unit 1300 may include a semiconductor device 1100 (for example, a semiconductor memory device such as a PRAM device) according to the embodiments described above and a memory controller 1200.

The semiconductor memory device 1100 may store data processed by the central processing unit (CPU) 1500 or data produced by the user interface 1600 through the memory controller 1200. The semiconductor memory device 1100 may constitute a solid state disk (SSD) acting as a semiconductor disk driver. In this case, the operation speed of the electronic system 1100 may be remarkably improved.

According to the embodiments set forth above, lower interconnections disposed between a semiconductor substrate and semiconductor diodes are formed of a metallic material. Thus, an increase of electrical resistance of the lower interconnections may be suppressed even though a semiconductor device including the lower interconnections is scaled down.

Further, since the semiconductor diodes are formed by patterning a single crystalline semiconductor substrate, crystalline defects in the semiconductor diodes can be significantly reduced. Thus, electrical characteristics of the semiconductor diodes may be improved to enhance the reliability of the semiconductor device.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming a semiconductor device, the method comprising:
   forming semiconductor pillars between isolation layers on a semiconductor substrate;
   forming undercut regions in the semiconductor substrate and under the semiconductor pillars; and
   forming lower interconnections in the undercut regions between the isolation layers and below the semiconductor pillars.

2. The method as claimed in claim 1, wherein forming semiconductor pillars includes etching the semiconductor substrate.

3. The method as claimed in claim 1, wherein forming semiconductor pillars includes using a selective epitaxial growth technique.

4. The method as claimed in claim 1, further comprising:
   forming an upper impurity region of a first conductivity type in the semiconductor pillars; and
   forming a lower impurity region of a second conductivity type in the semiconductor pillars.

5. The method as claimed in claim 4, further comprising:
   forming a heavily doped impurity region in the lower impurity region, the heavily doped impurity region being spaced apart from the upper impurity region.

6. The method as claimed in claim 5, wherein forming the heavily doped impurity region includes forming recessed regions in the semiconductor substrate under openings between adjacent semiconductor pillars and doping the semiconductor substrate exposed by the recessed regions.

7. The method as claimed in claim 6, wherein forming undercut regions includes etching the semiconductor substrate exposed by the recessed regions.

8. The method as claimed in claim 7, wherein etching the semiconductor substrate includes anisotropic etching.

9. The method as claimed in claim 1, wherein forming the undercut regions include forming first undercut regions under the semiconductor pillar and second undercut regions between adjacent first undercut regions, the second undercut regions being wider than the first undercut regions.

10. The method as claimed in claim 9, wherein forming lower interconnections in the undercut regions includes depositing a material different from the semiconductor substrate.

11. The method as claimed in claim 10, wherein depositing the material includes covering exposed regions of the semiconductor pillars.

12. The method as claimed in claim 11, wherein depositing the material includes conformally depositing the material.

13. The method as claimed in claim 12, wherein conformally depositing the material includes conformally depositing the material to a thickness such that voids are formed in the second undercut regions.

14. The method as claimed in claim 13, further comprising filling the voids with another conductive material.

15. The method as claimed in claim 11, wherein depositing the material includes filling the undercut regions with the material.

16. The method as claimed in claim 10, wherein forming second undercut regions includes etching the semiconductor substrate to have a plurality of triangular shapes.

17. The method as claimed in claim 10, wherein forming second undercut regions includes etching the semiconductor substrate to have a plurality of sloped shapes with a central flat portion.

18. The method as claimed in claim 1, wherein forming lower interconnections in the undercut regions includes depositing a material different from the semiconductor substrate.

19. The method as claimed in claim 18, wherein the material is a metallic material.

20. The method as claimed in claim 18, wherein depositing the material includes covering exposed regions of the semiconductor pillars.

21. The method as claimed in claim 1, further comprising forming memory elements on the semiconductor pillars.

22. The method as claimed in claim 21, wherein the memory elements employ variable resistors.

23. The method as claimed in claim 21, wherein the semiconductor substrate includes a first region having the memory elements and a second region, wherein top surfaces of the semiconductor pillars are coplanar with a top surface of the semiconductor substrate of the second region.

24. A method of forming a memory device, the method comprising:
   forming selection elements in a semiconductor substrate;
   forming lower interconnections in the semiconductor substrate and under the selection elements, the lower interconnections being made of a material different from the semiconductor substrate; and
   forming memory elements on the selection elements.

25. The method as claimed in claim 24, wherein forming selection elements includes etching the semiconductor substrate.

26. The method as claimed in claim 24, wherein forming selection elements includes using a selective epitaxial growth technique.

27. The method as claimed in claim 24, wherein the material includes a metal.

* * * * *